US012080991B2

(12) United States Patent
Lee et al.

(10) Patent No.: US 12,080,991 B2
(45) Date of Patent: Sep. 3, 2024

(54) SURFACE EMITTING LASER DEVICE AND LIGHT EMITTING DEVICE INCLUDING THE SAME

(71) Applicant: SUZHOU LEKIN SEMICONDUCTOR CO., LTD., Taicang (CN)

(72) Inventors: Yong Gyeong Lee, Seoul (KR); Se Yeon Jung, Seoul (KR); Tae Yong Lee, Seoul (KR)

(73) Assignee: SUZHOU LEKIN SEMICONDUCTOR CO., LTD., Suzhou (CN)

( * ) Notice: Subject to any disclaimer, the term of this patent is extended or adjusted under 35 U.S.C. 154(b) by 894 days.

(21) Appl. No.: 17/262,839

(22) PCT Filed: Jul. 26, 2019

(86) PCT No.: PCT/KR2019/009313
§ 371 (c)(1),
(2) Date: Jan. 25, 2021

(87) PCT Pub. No.: WO2020/022827
PCT Pub. Date: Jan. 30, 2020

(65) Prior Publication Data
US 2021/0143608 A1    May 13, 2021

(30) Foreign Application Priority Data

Jul. 27, 2018   (KR) .................. 10-2018-0088131

(51) Int. Cl.
*H01S 3/00*        (2006.01)
*H01S 5/042*       (2006.01)
(Continued)

(52) U.S. Cl.
CPC ...... *H01S 5/04254* (2019.08); *H01S 5/04253* (2019.08); *H01S 5/04256* (2019.08);
(Continued)

(58) Field of Classification Search
CPC ............ H01S 5/04254; H01S 5/04253; H01S 5/04256; H01S 5/18311; H01S 5/18361; H01S 5/423
See application file for complete search history.

(56) References Cited

U.S. PATENT DOCUMENTS

| 5,115,441 A | 5/1992 | Kopf et al. |
| 7,505,503 B2 | 3/2009 | Nguyen et al. |
| 8,023,543 B2 * | 9/2011 | Otoma ................ H01S 5/04254 |
| | | 372/46.01 |
| 9,983,375 B2 * | 5/2018 | Watanabe ............ H01S 5/0425 |

(Continued)

FOREIGN PATENT DOCUMENTS

| JP | 2007-59672 A | 3/2007 |
| JP | 2010-192650 A | 9/2010 |

(Continued)

*Primary Examiner* — Kinam Park
(74) *Attorney, Agent, or Firm* — Birch, Stewart, Kolasch & Birch, LLP

(57) ABSTRACT

An embodiment relates to a surface emitting laser device and a light emitting device including the same. The surface emitting laser device according to an embodiment may comprise: a substrate; a first reflective layer arranged on the substrate; an active layer arranged on the first reflective layer; an aperture layer arranged on the active layer and comprising an opening; a second reflective layer arranged on the active layer; a transparent electrode layer arranged on the second reflective layer; and a metal electrode layer arranged on the transparent electrode layer. The transparent electrode layer may comprise a first area perpendicularly overlapping the opening and multiple second areas extending from the first area. The multiple second areas may be arranged outside the opening along the circumferential direction of the opening and spaced apart from each other. The multiple second areas may be arranged and spaced apart from each
(Continued)

other so as to correspond to the circumference of the opening. The metal electrode layer may electrically contact the second reflective layer between the multiple second areas.

20 Claims, 34 Drawing Sheets

(51) Int. Cl.
*H01S 5/183* (2006.01)
*H01S 5/42* (2006.01)

(52) U.S. Cl.
CPC ...... *H01S 5/18311* (2013.01); *H01S 5/18361* (2013.01); *H01S 5/423* (2013.01)

(56) References Cited

U.S. PATENT DOCUMENTS

| | | | | |
|---|---|---|---|---|
| 2010/0098127 | A1* | 4/2010 | Higuchi | H01S 5/18341 |
| | | | | 257/E33.002 |
| 2010/0127617 | A1* | 5/2010 | Hayafuji | H10K 50/814 |
| | | | | 313/503 |
| 2015/0146749 | A1* | 5/2015 | Hoshino | H01S 5/04257 |
| | | | | 372/36 |
| 2017/0302057 | A1* | 10/2017 | Tazawa | H01S 5/18308 |
| 2018/0226771 | A1* | 8/2018 | Tazawa | H01S 5/04253 |
| 2019/0334318 | A1* | 10/2019 | Hamaguchi | H01S 5/18361 |
| 2019/0363515 | A1* | 11/2019 | Kuramoto | H01S 5/04253 |

FOREIGN PATENT DOCUMENTS

| | | |
|---|---|---|
| JP | 2012-113134 A | 6/2012 |
| JP | 2013-21278 A | 1/2013 |
| JP | 2014-127511 A | 7/2014 |
| KR | 10-2004-0100962 A | 12/2004 |

* cited by examiner

[FIG. 1]
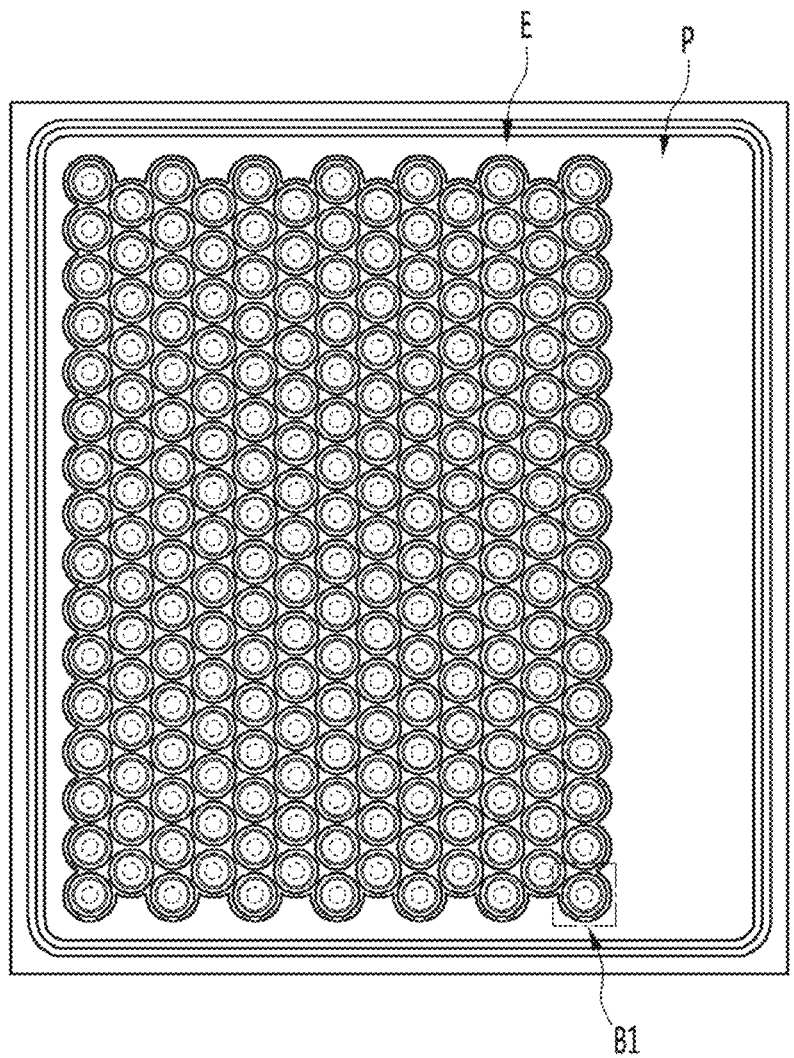

[FIG. 2]
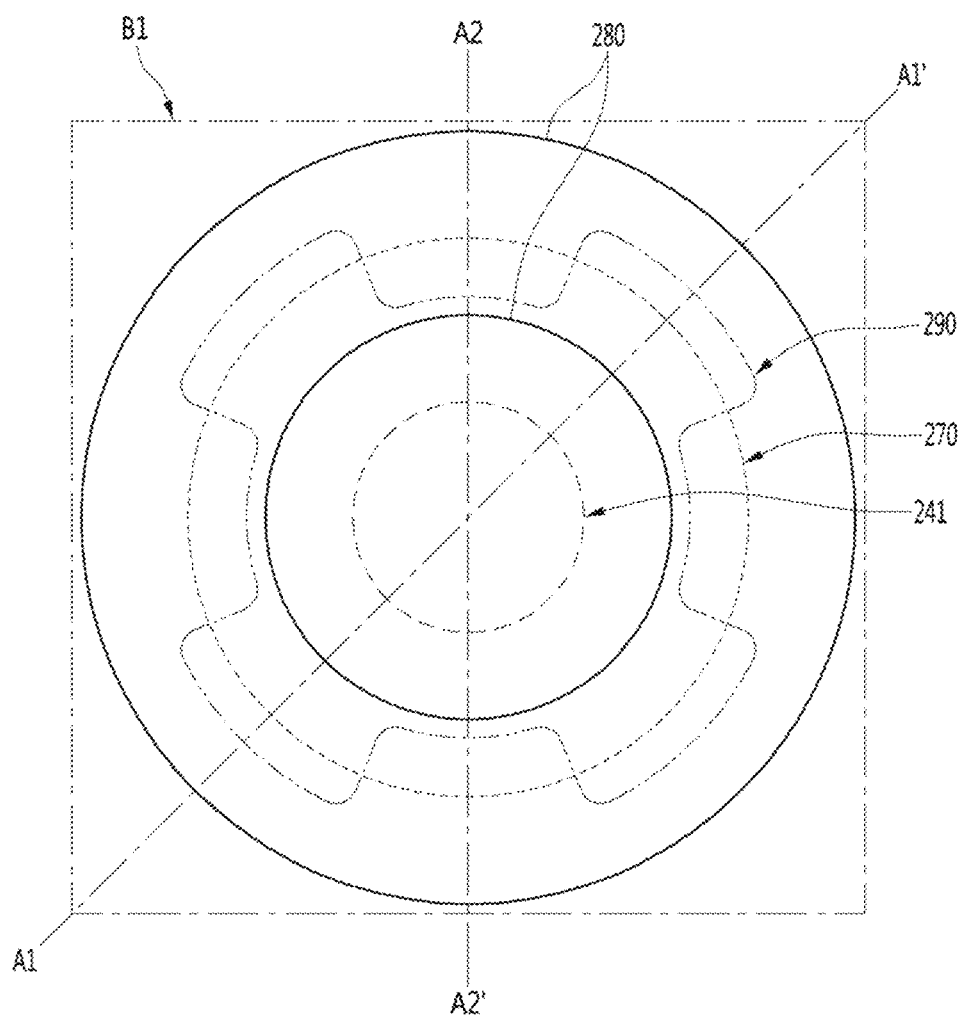

[FIG. 3a]
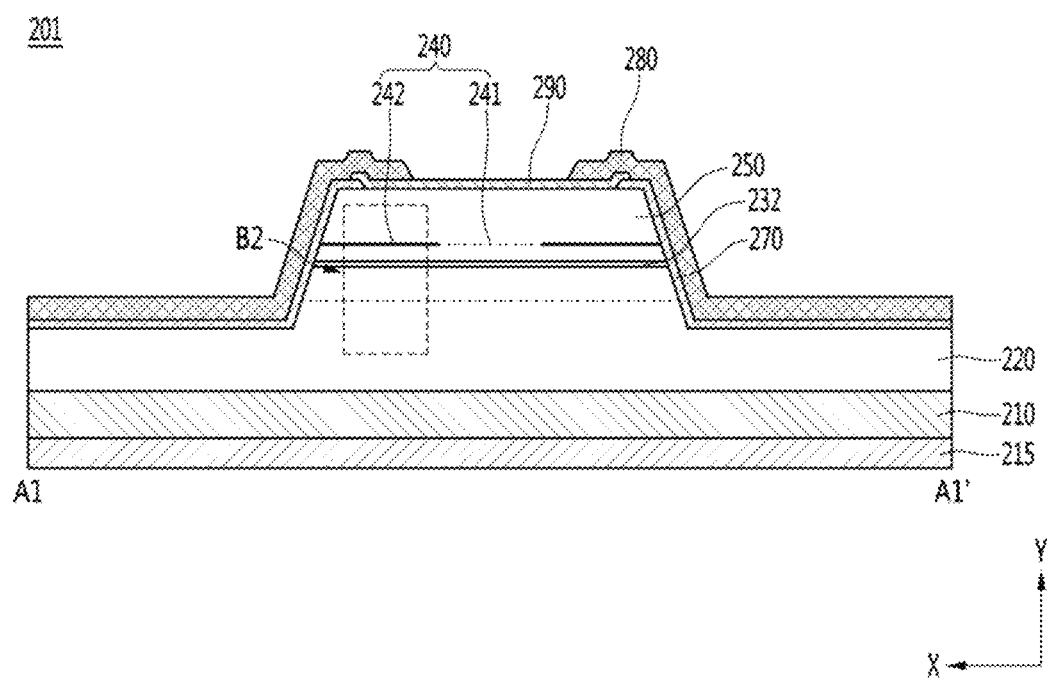

[FIG. 3b]
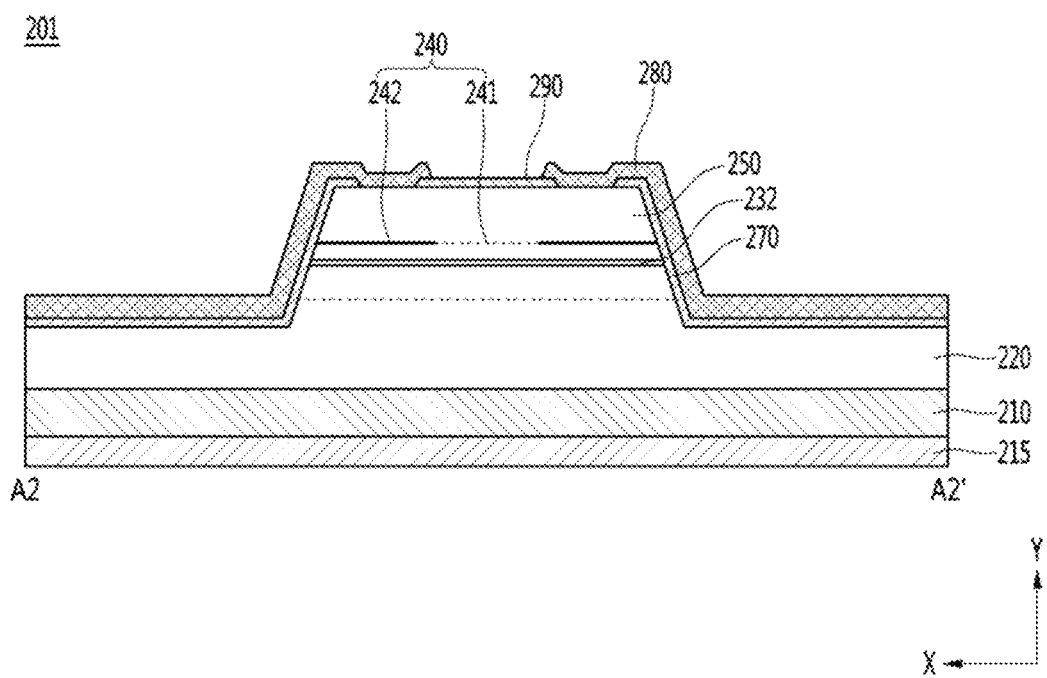

[FIG. 4]
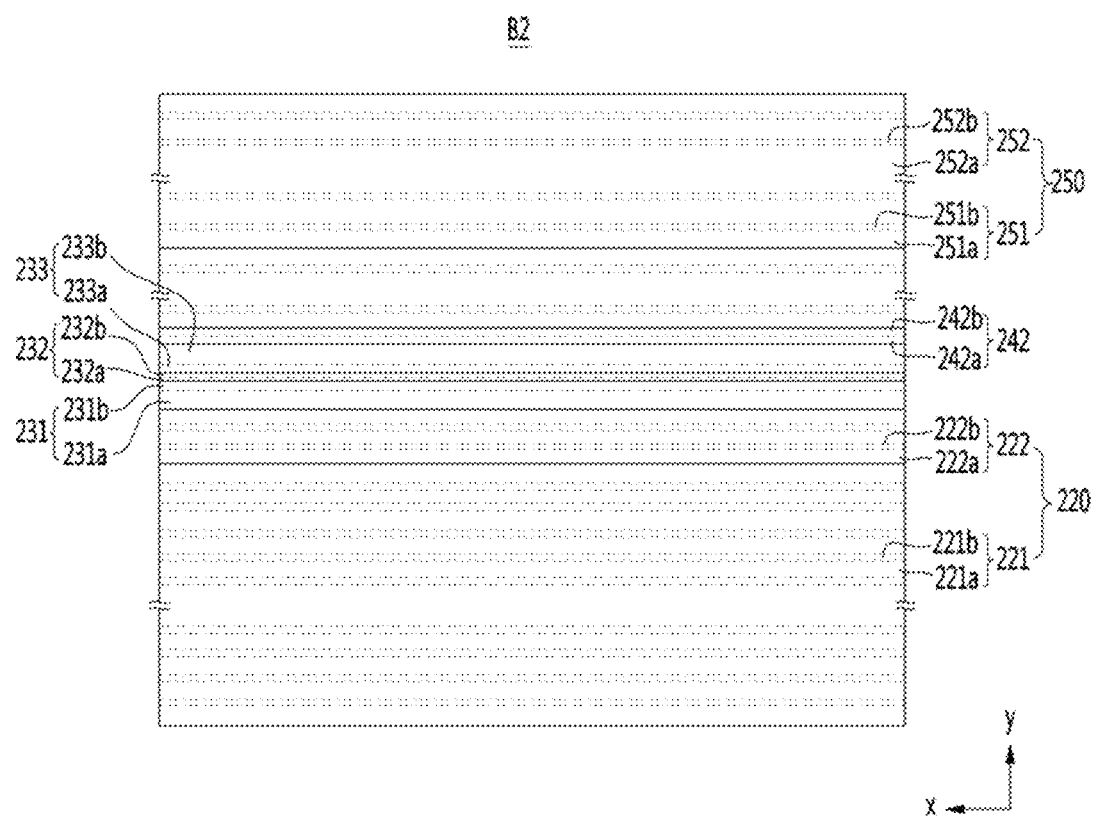

[FIG. 5a]
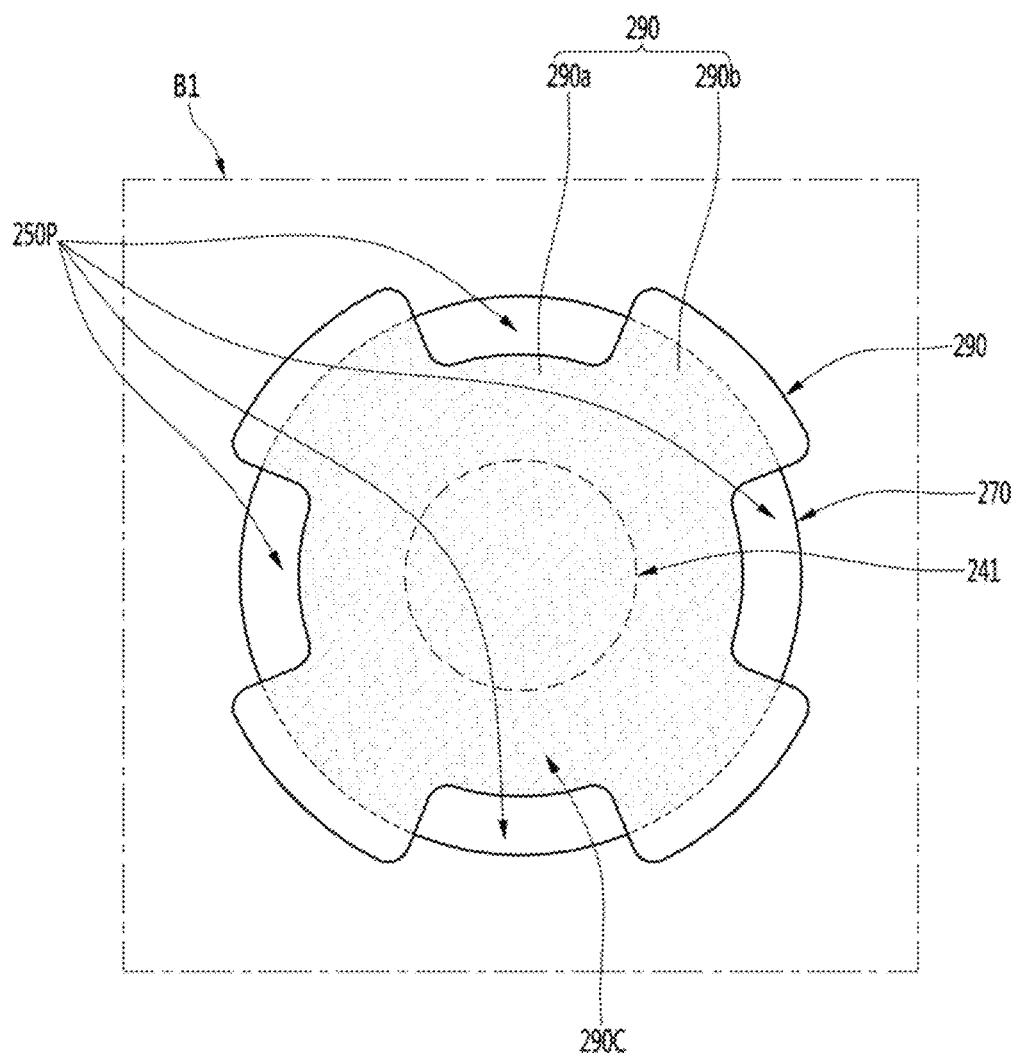

[FIG. 5b]
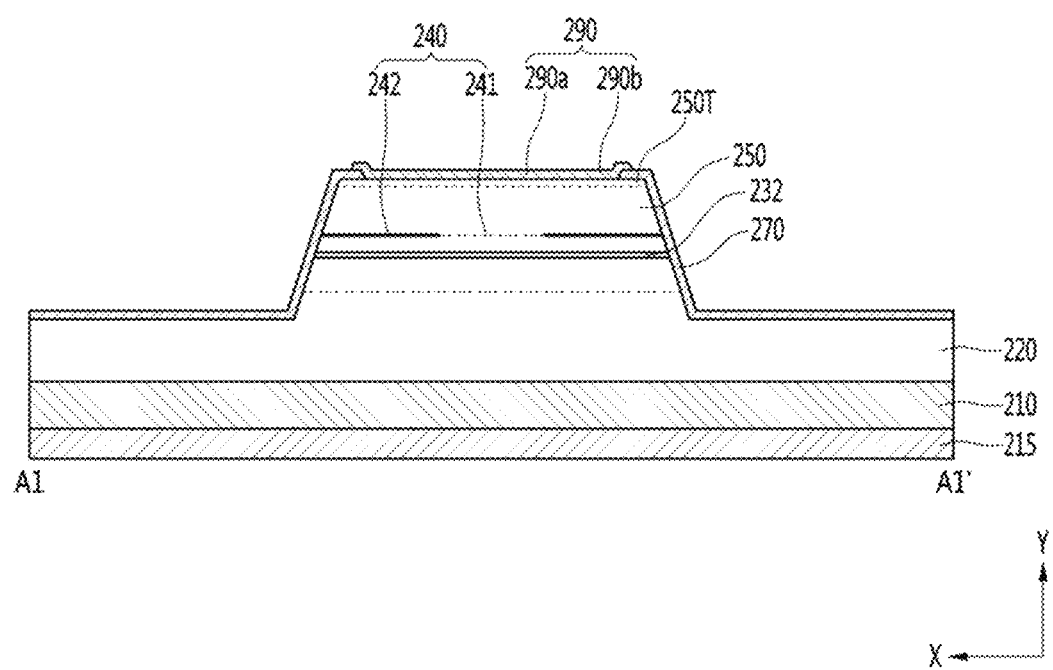

[FIG. 5c]
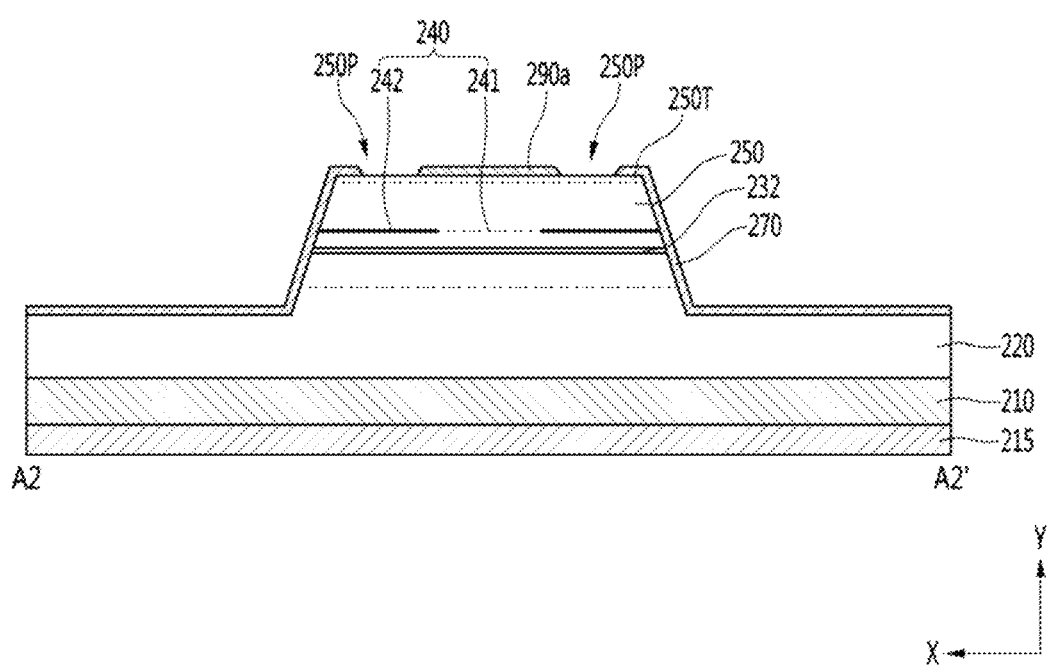

[FIG. 6a]
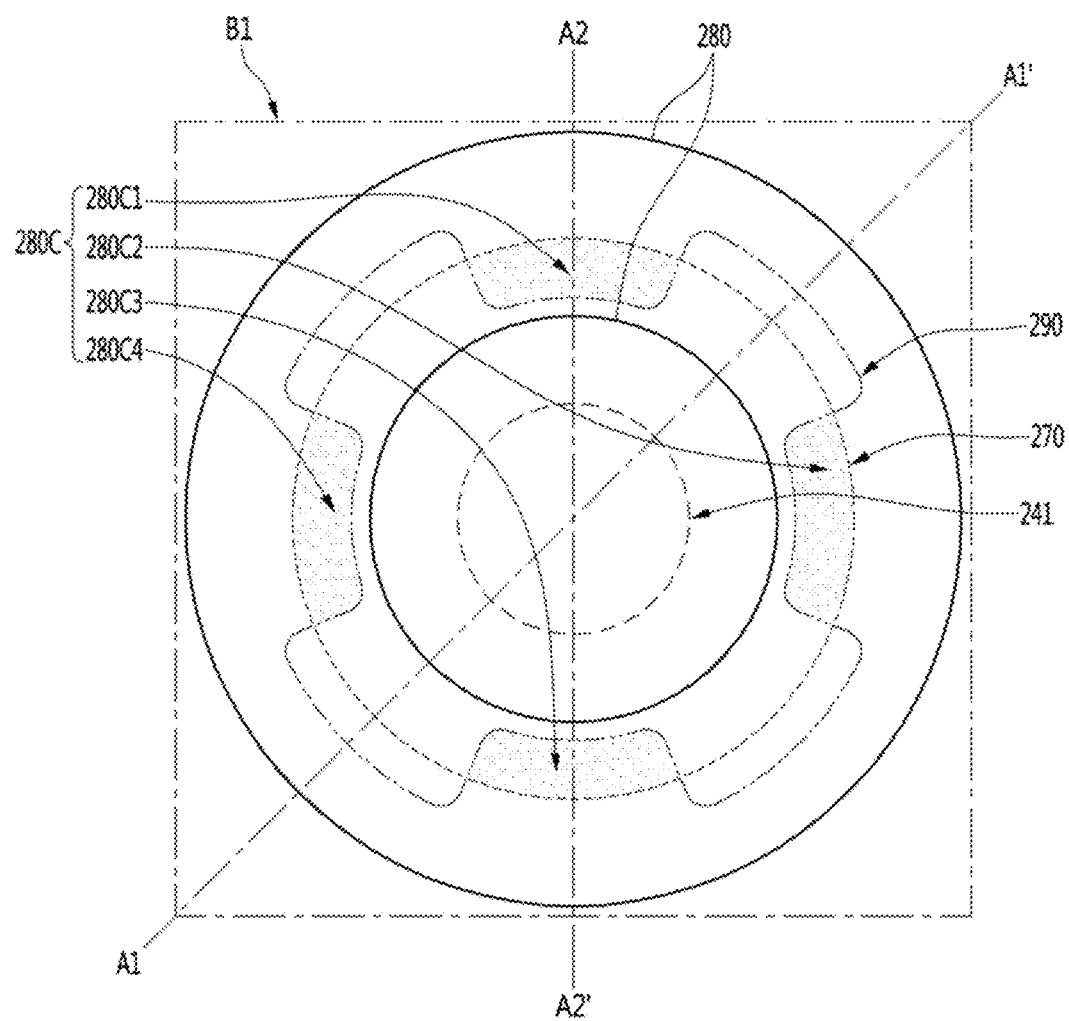

[FIG. 6b]
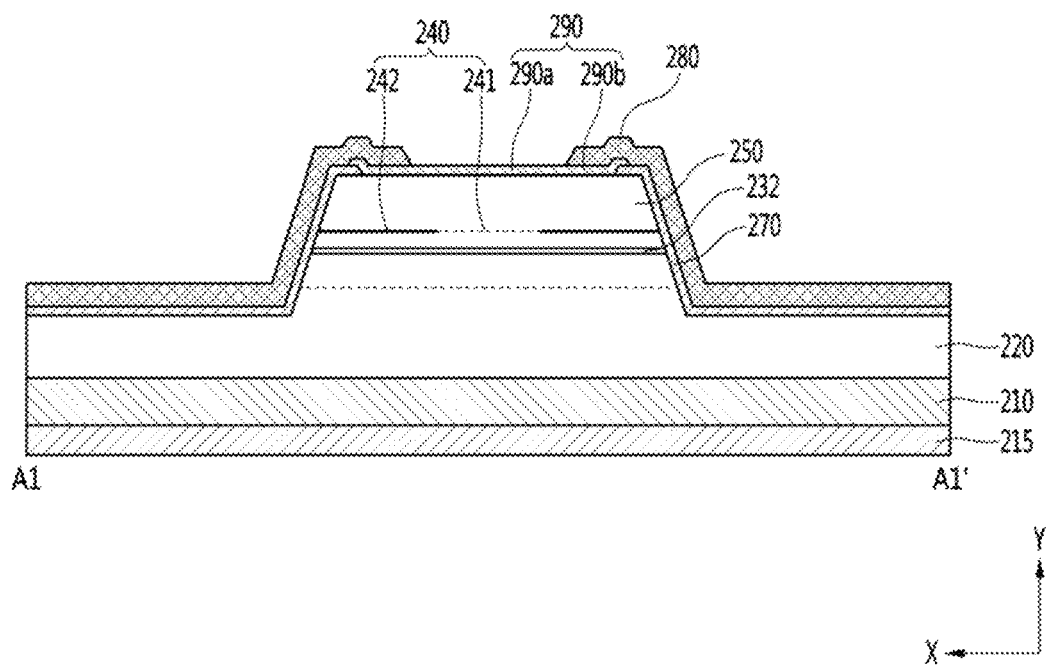

[FIG. 6c]
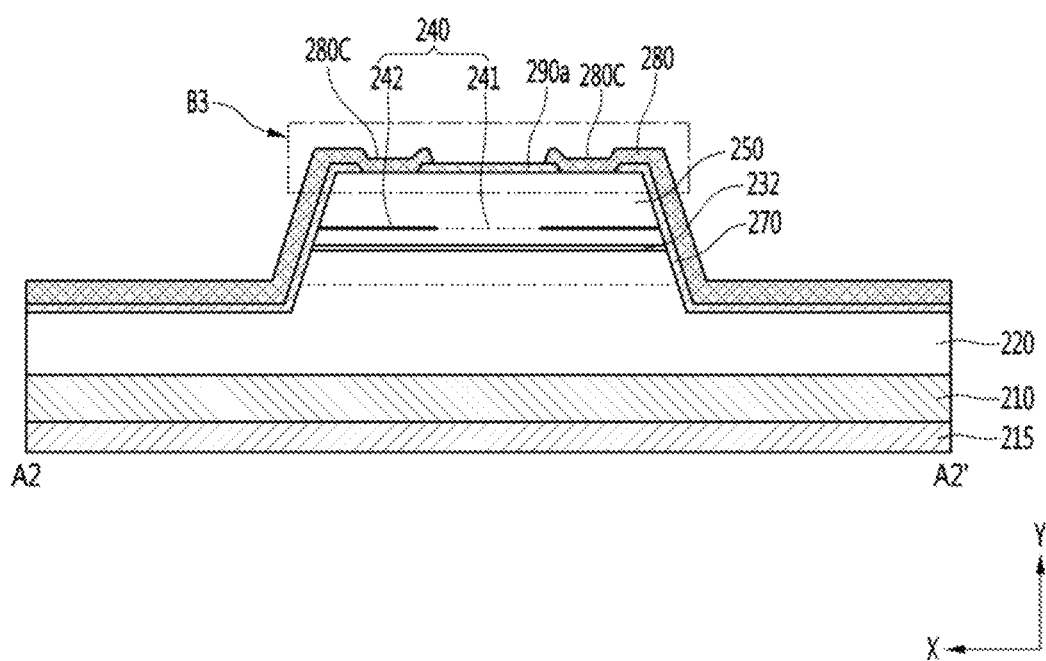

[FIG. 7]
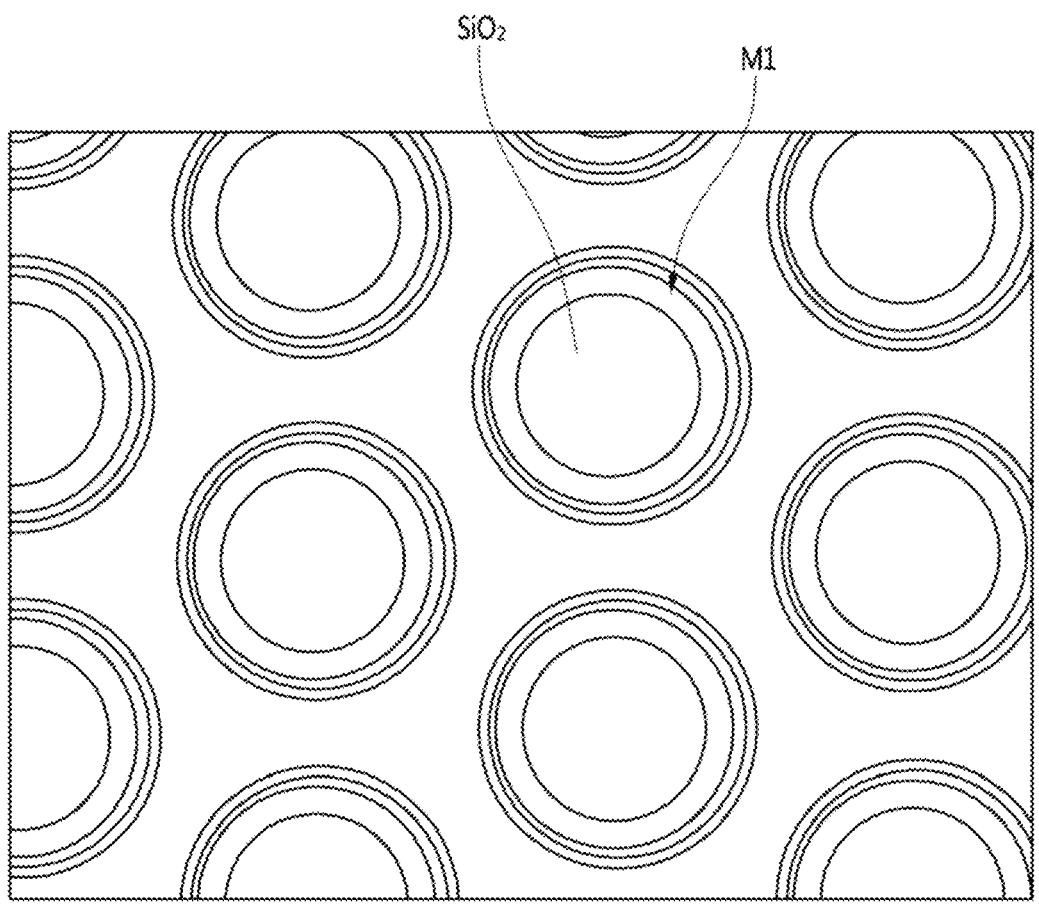

[FIG. 8]
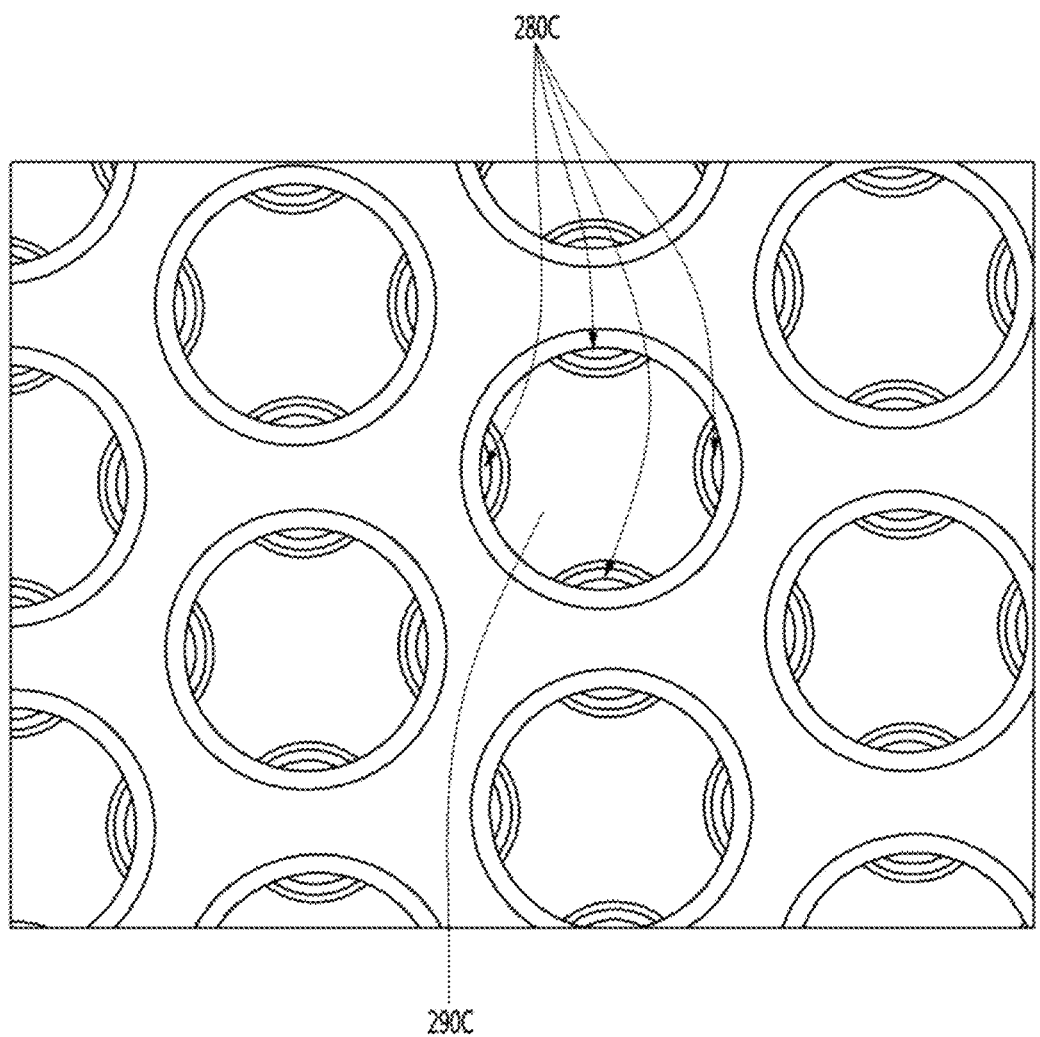

[FIG. 9a]
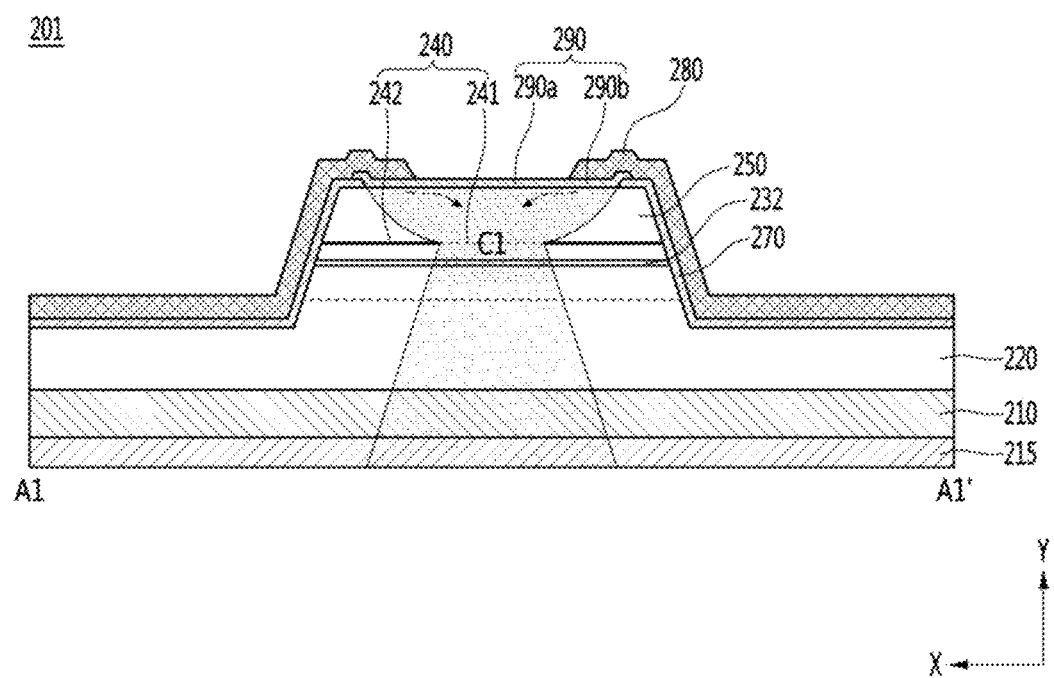

[FIG. 9b]
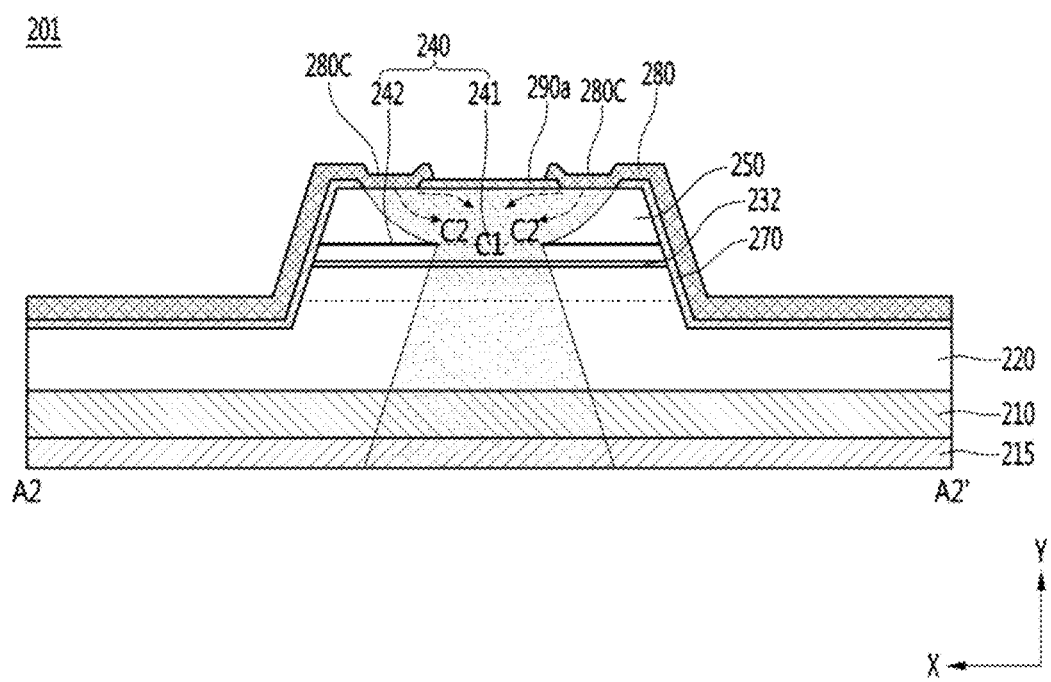

[FIG. 10a]
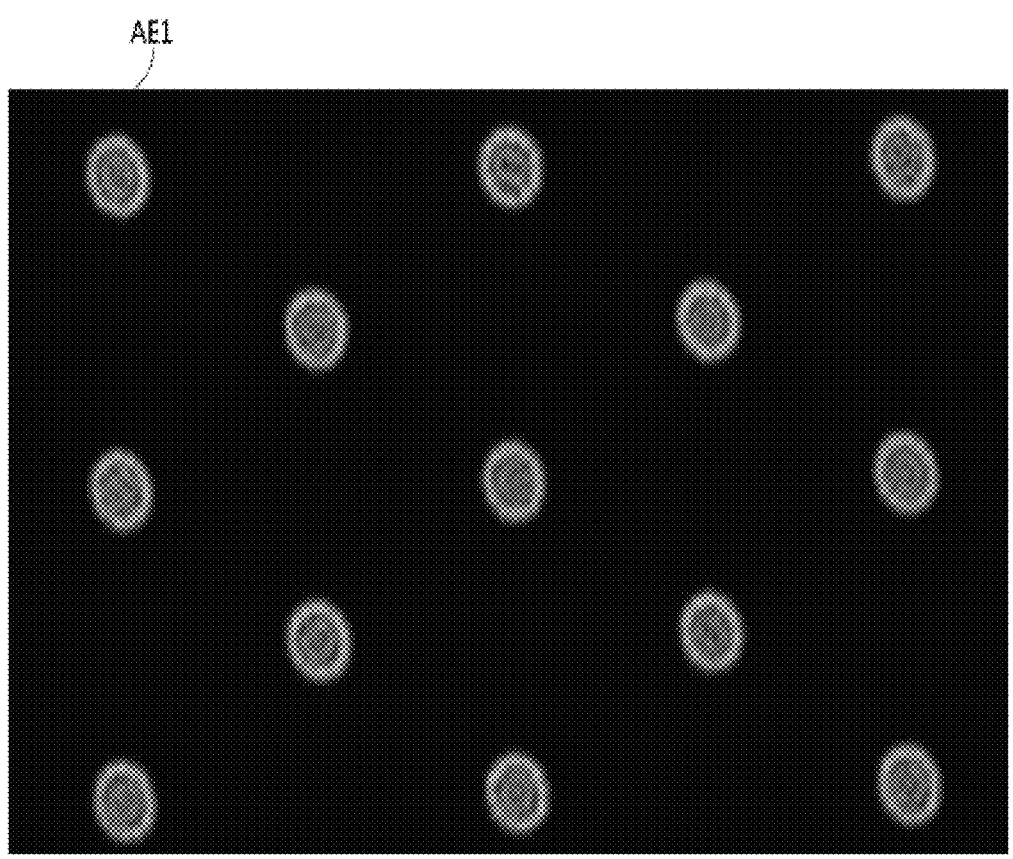

[FIG. 10b]
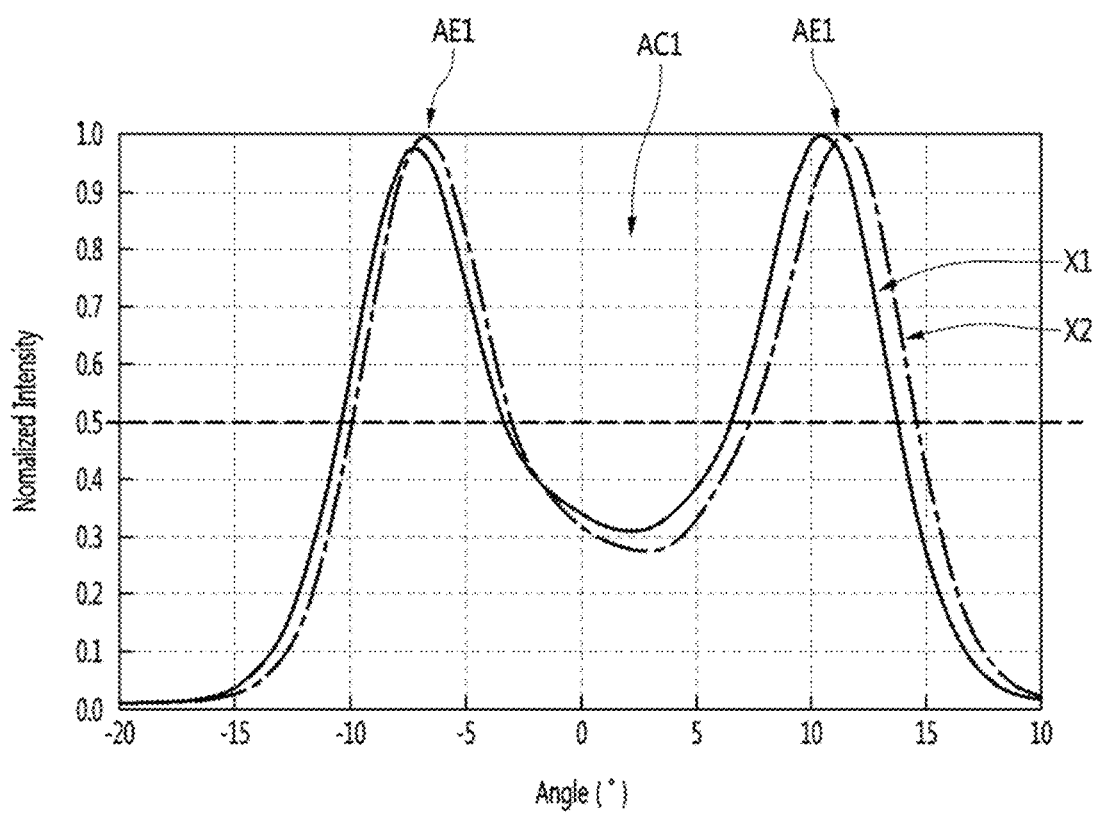

[FIG. 11a]
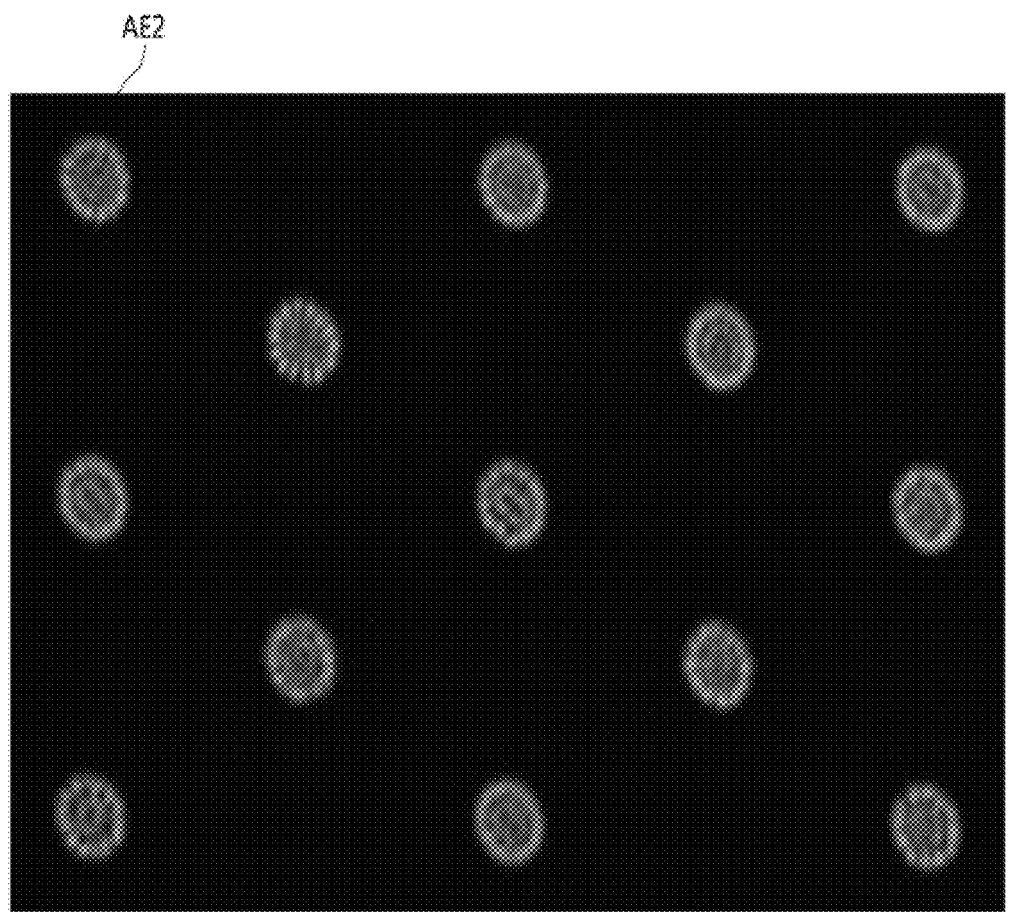

[FIG. 11b]
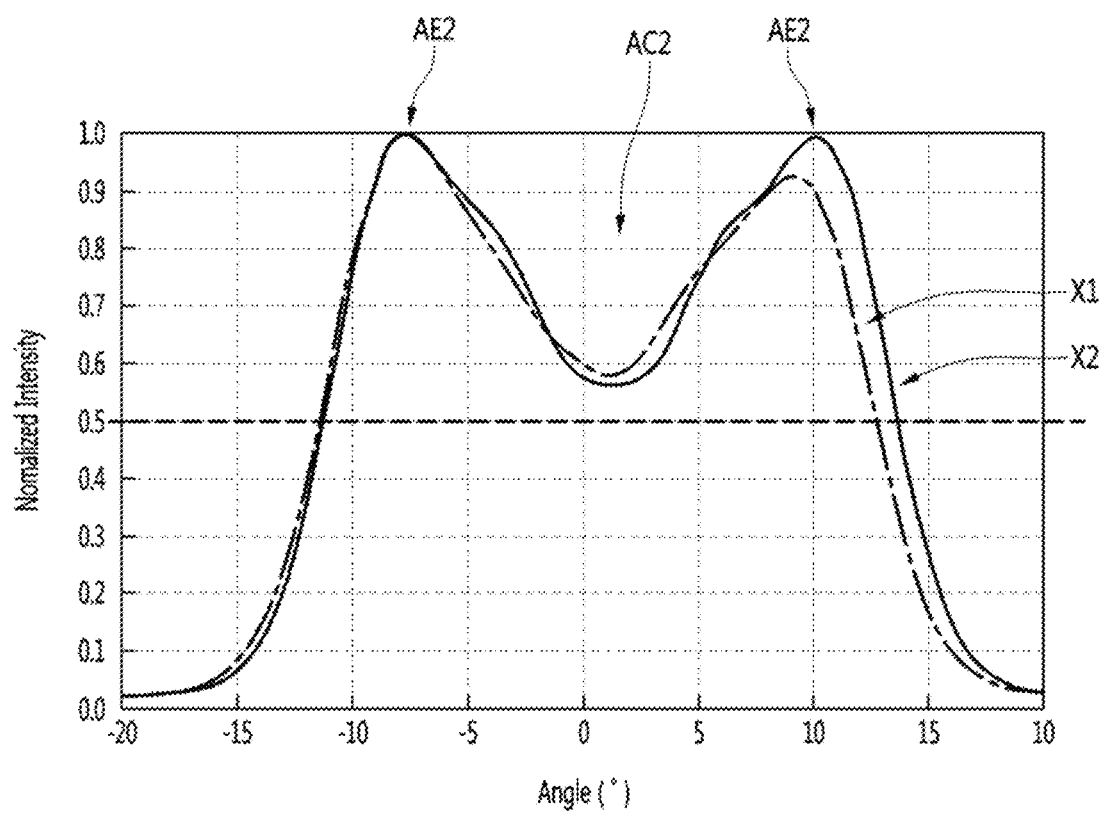

[FIG. 12]
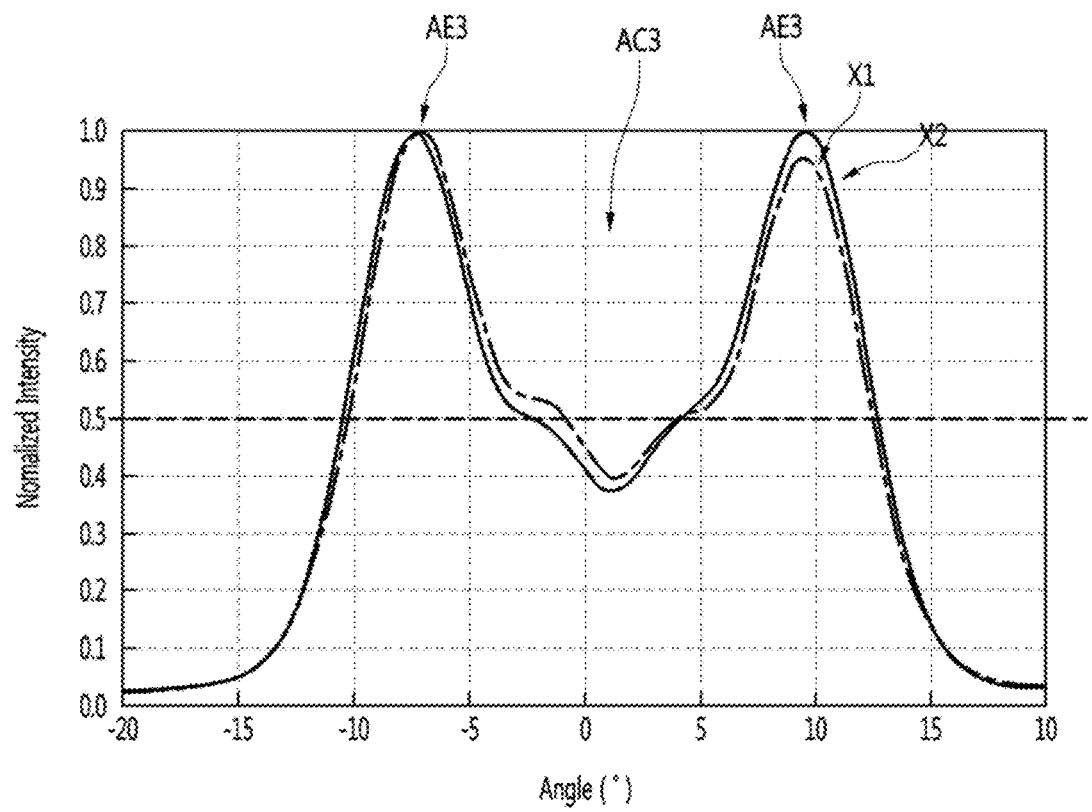
[FIG. 13]
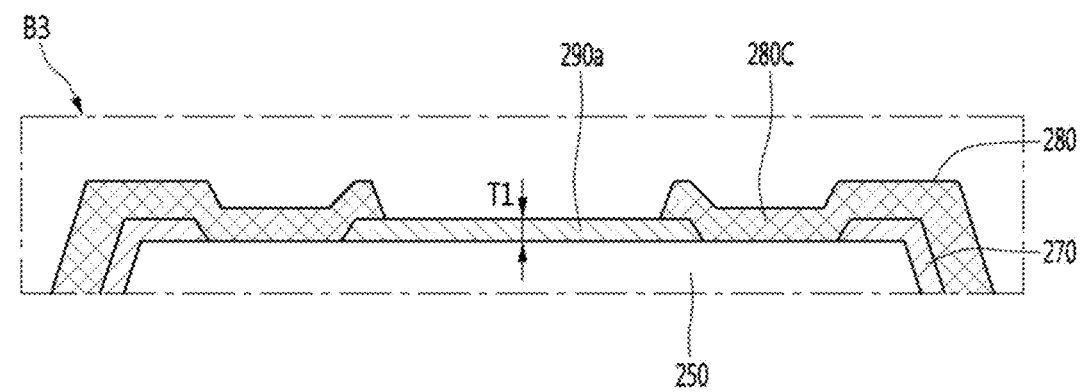

[FIG. 14]
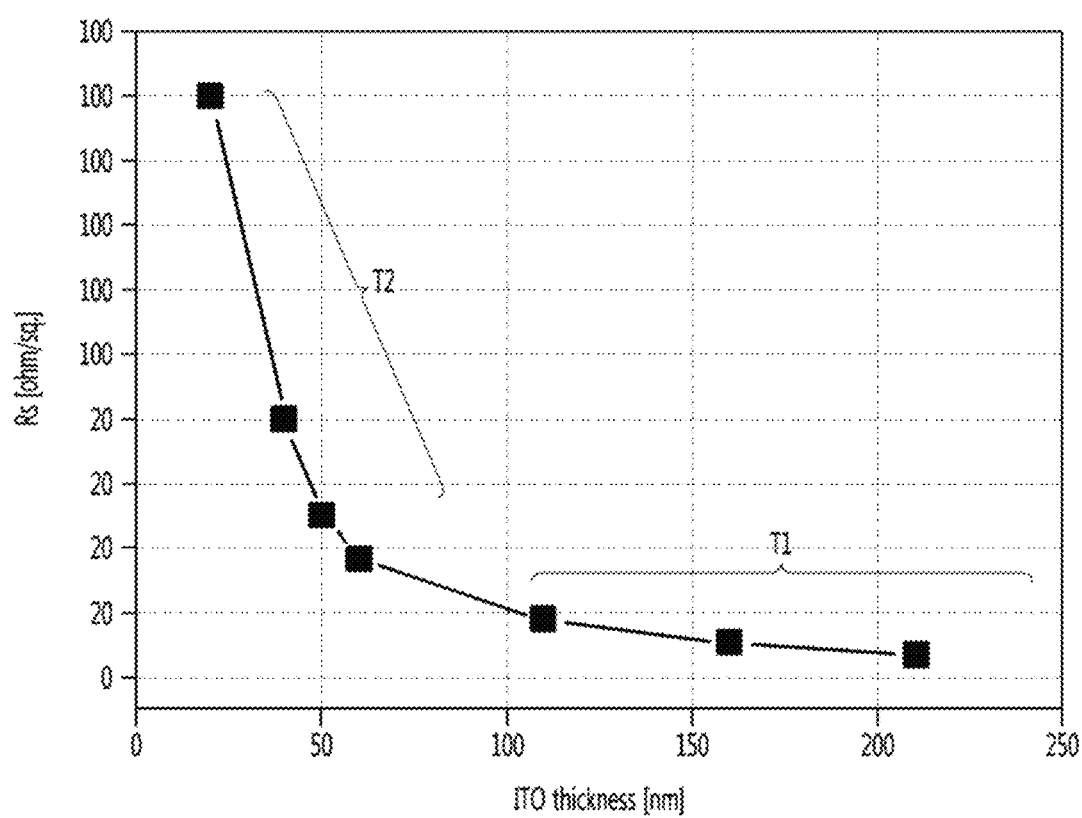

[FIG. 15]
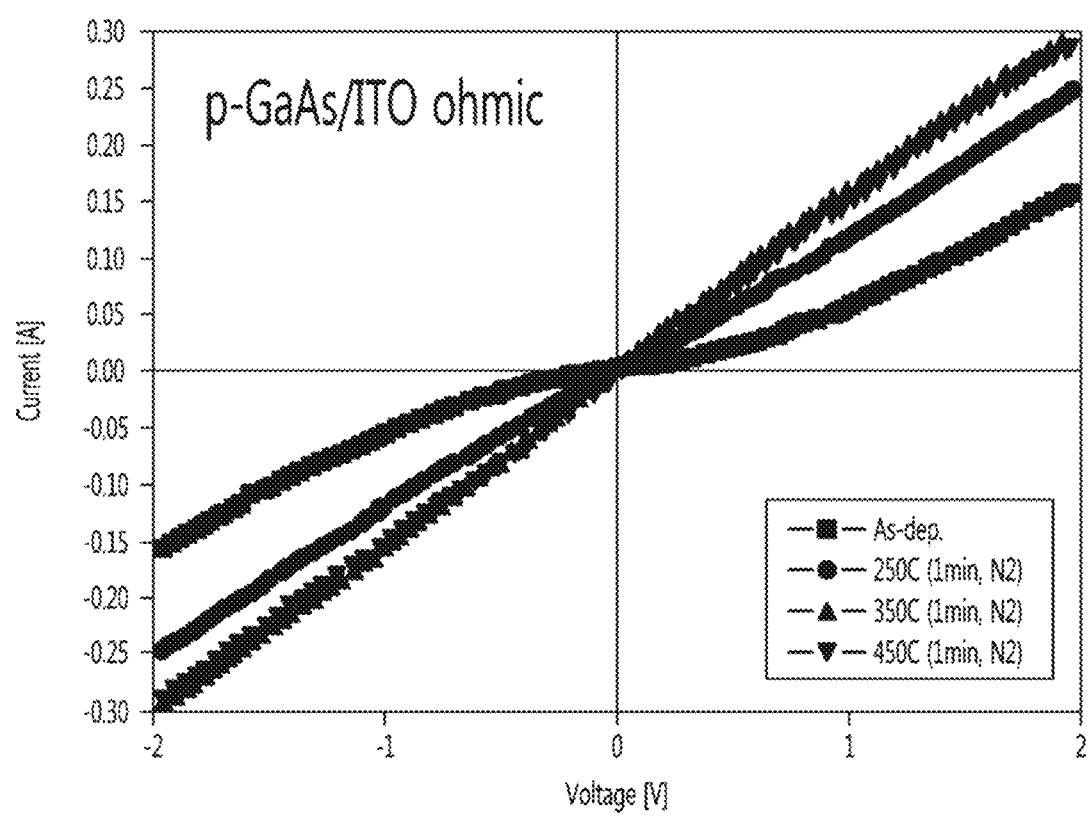

[FIG. 16a]
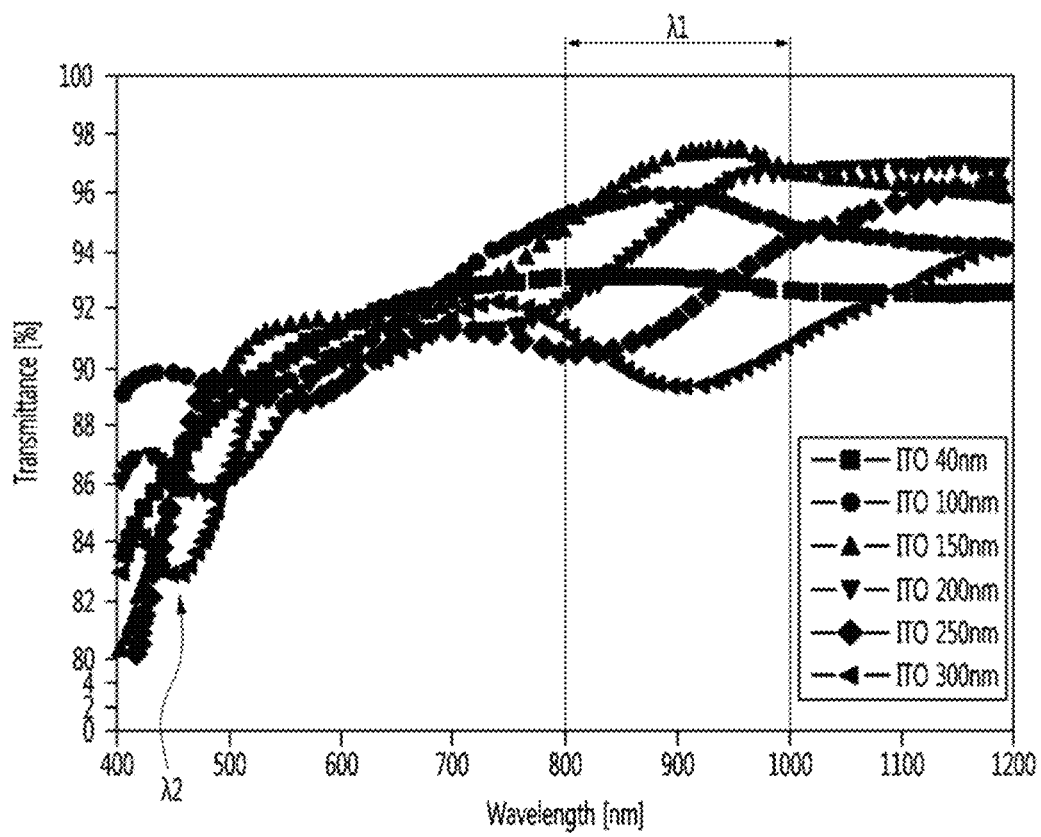
[FIG. 16b]
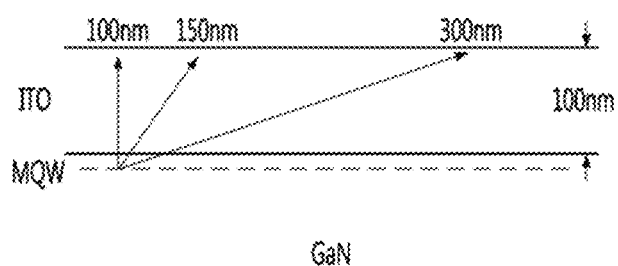

[FIG. 16c]
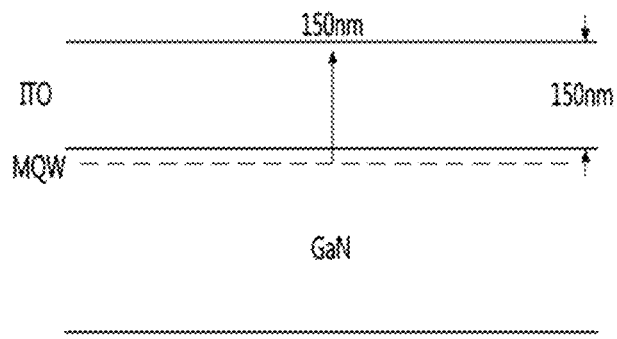
[FIG. 17a]
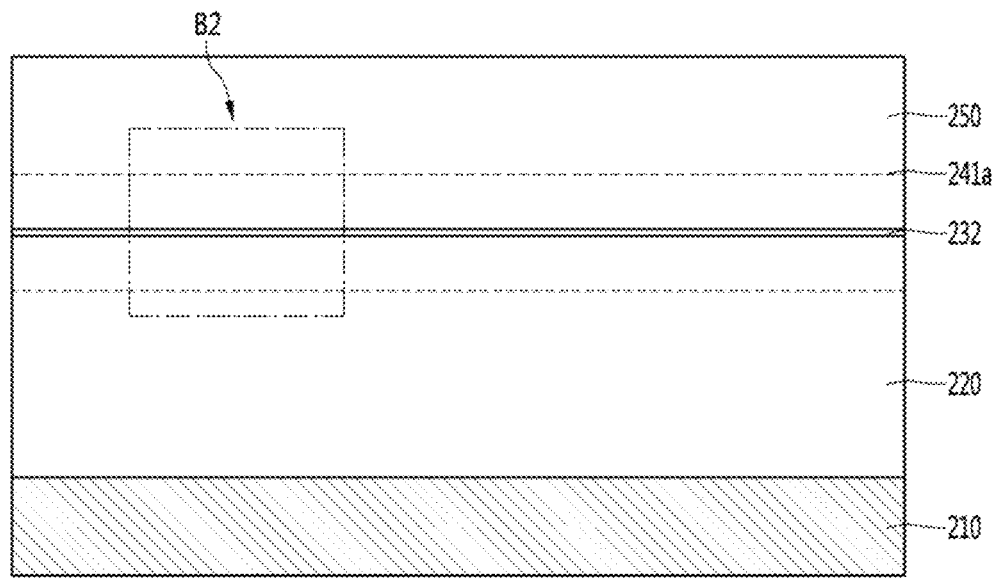

[FIG. 17b]
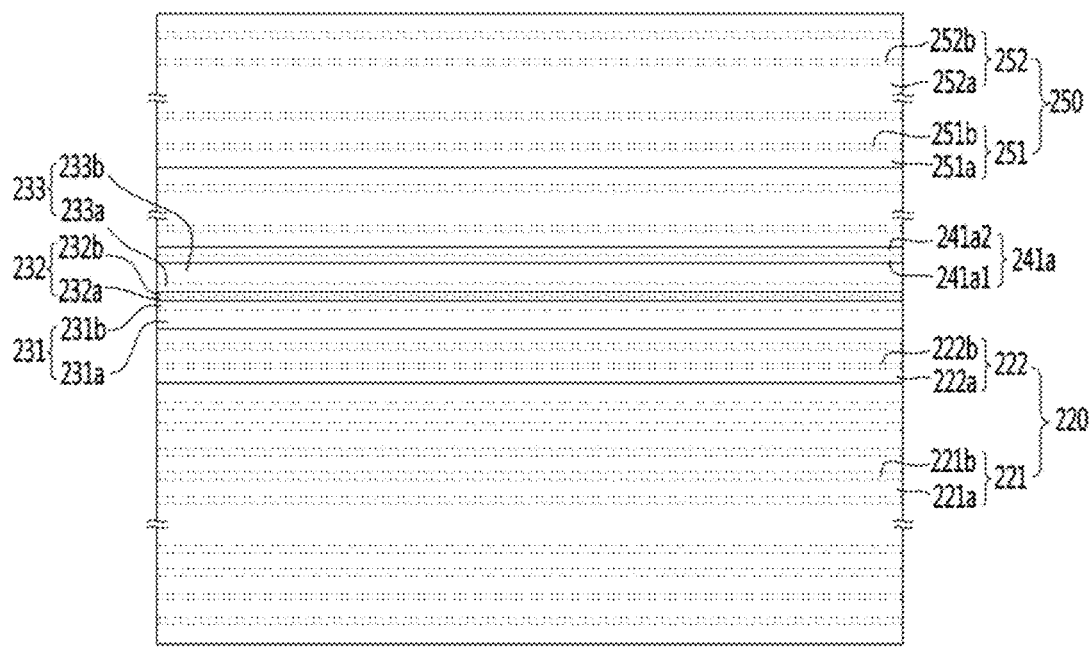
[FIG. 18]
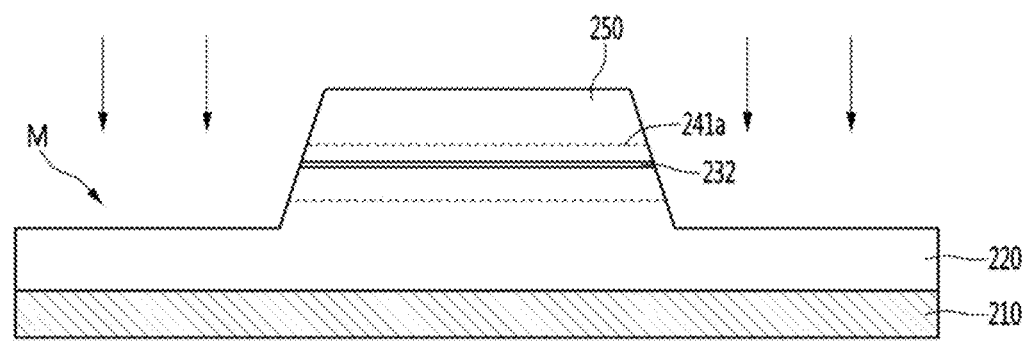

[FIG. 19]
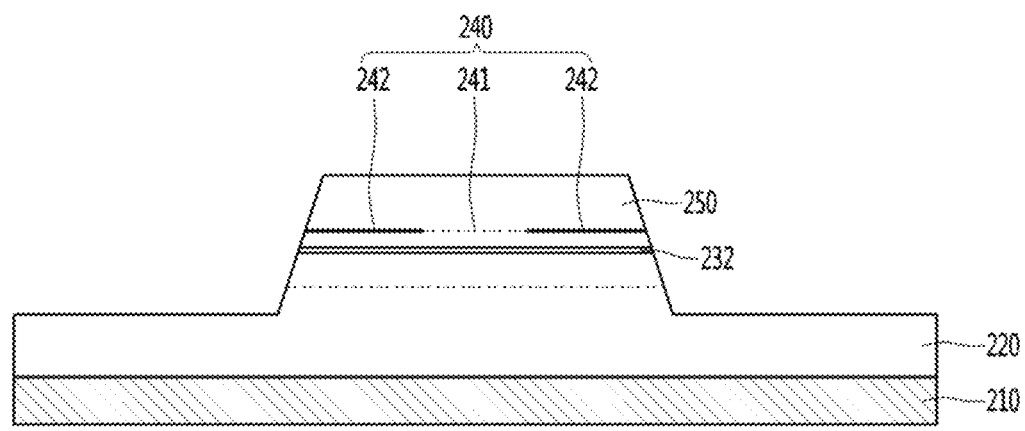
[FIG. 20]
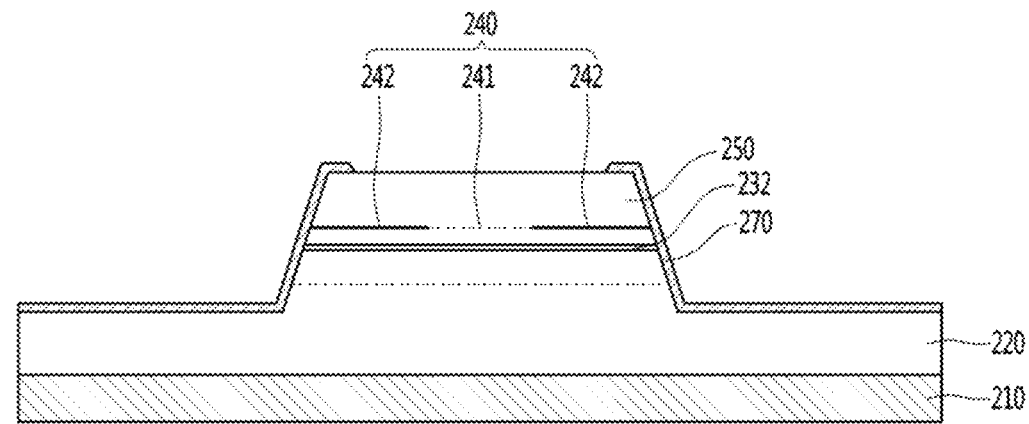

[FIG. 21a]
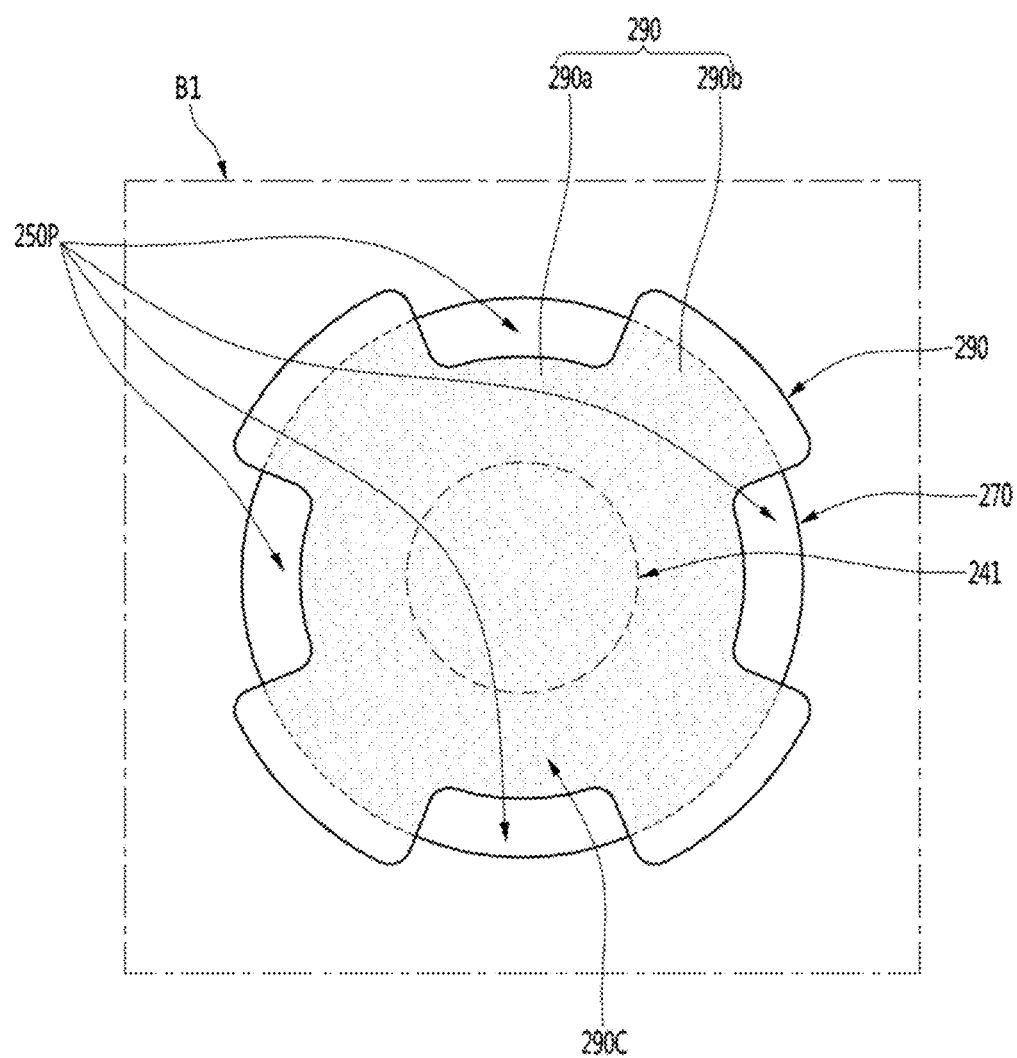

[FIG. 21b]
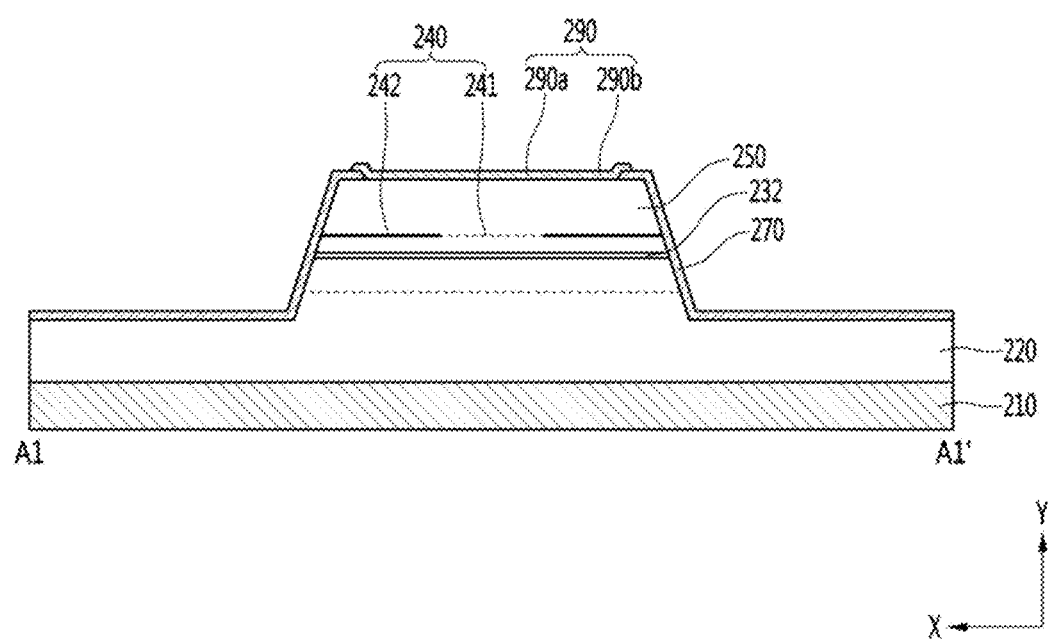

[FIG. 21c]
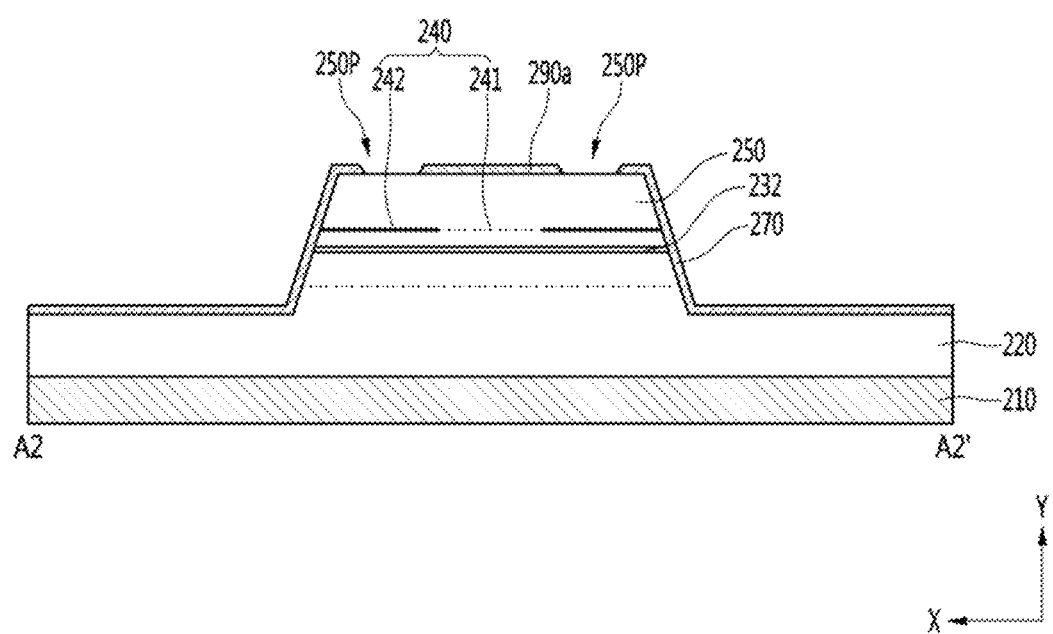

[FIG. 22a]
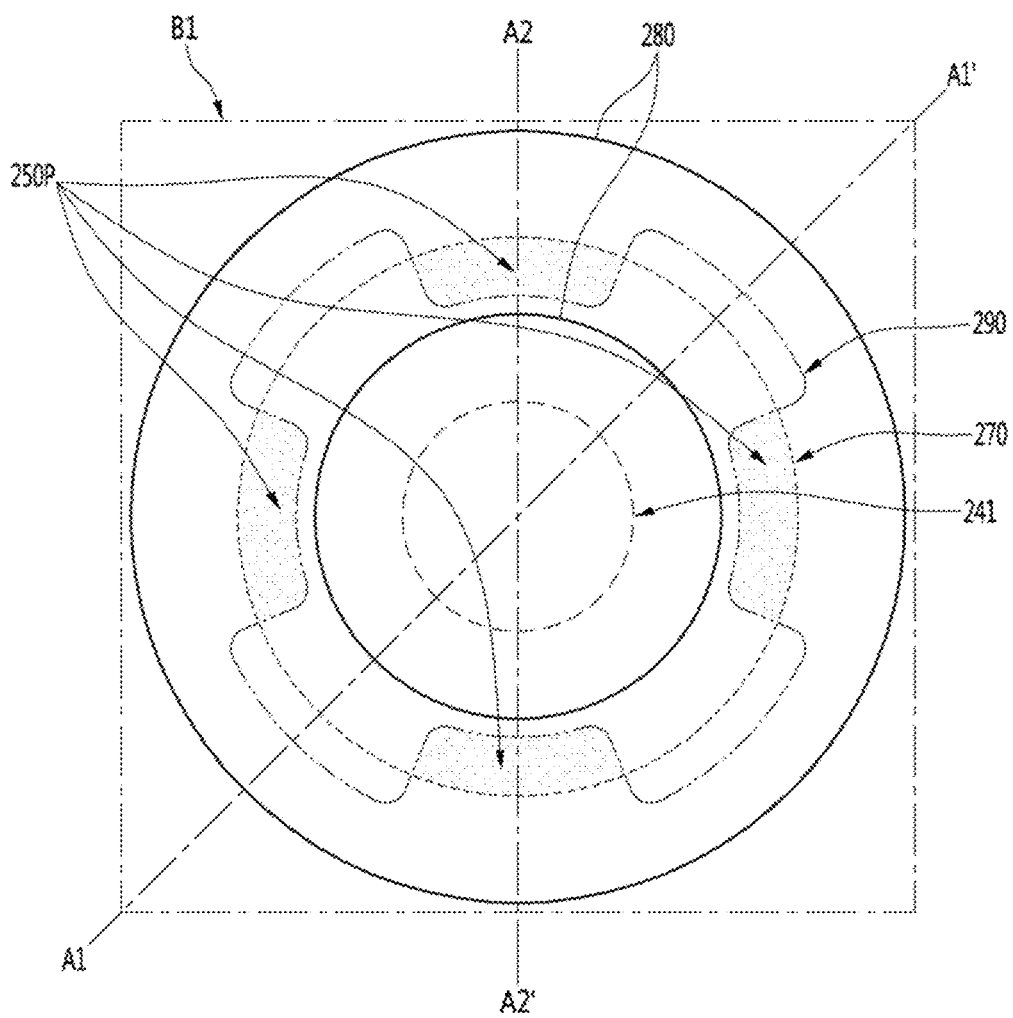

[FIG. 22b]
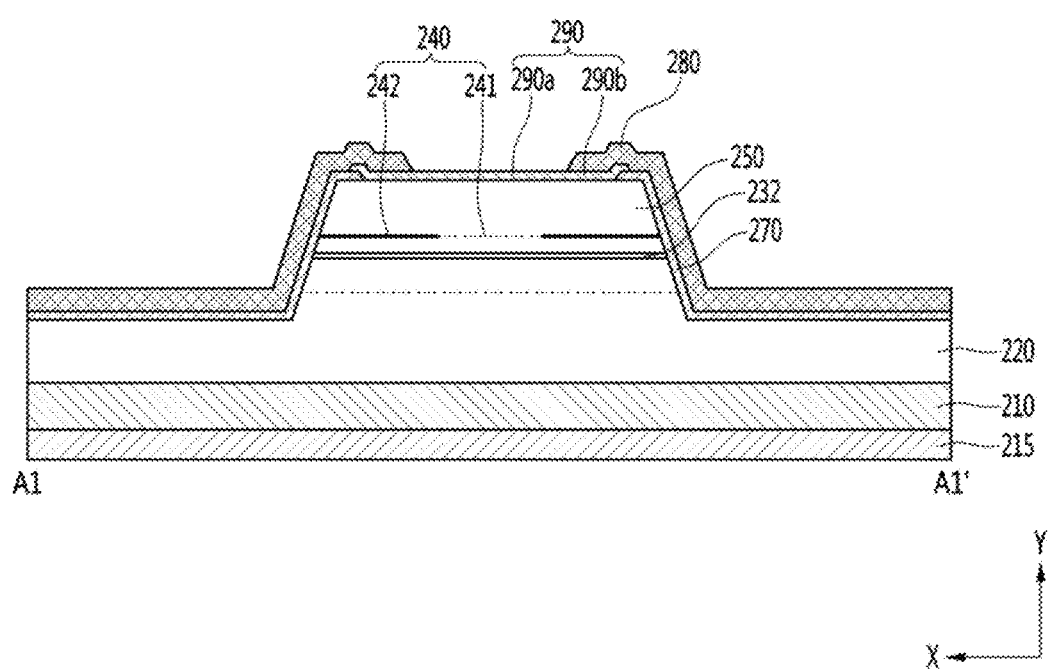

[FIG. 22c]
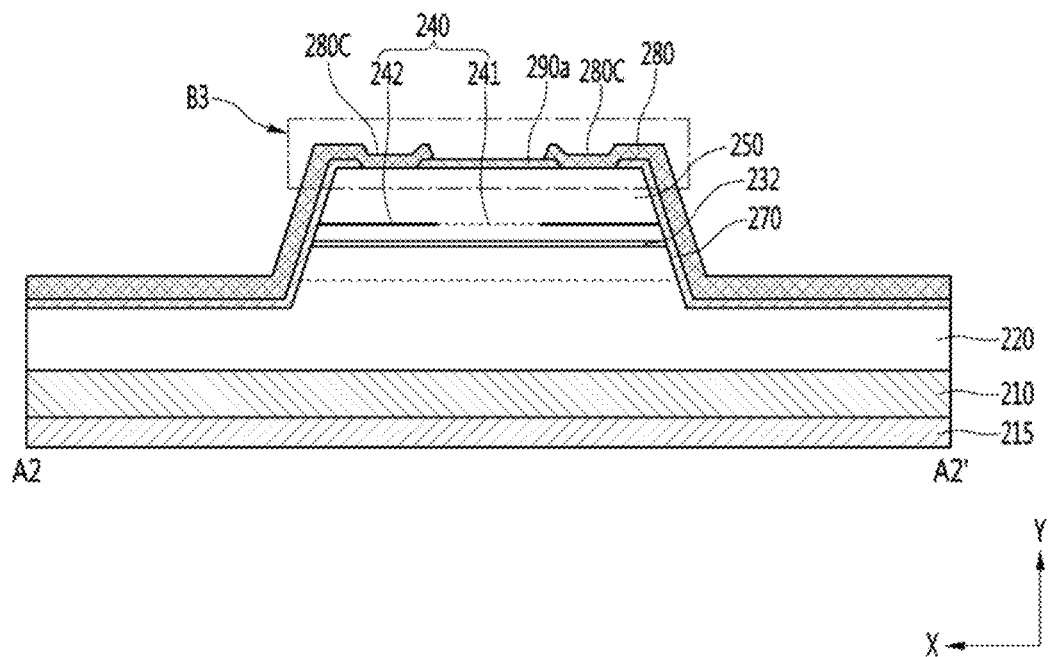
[FIG. 23]
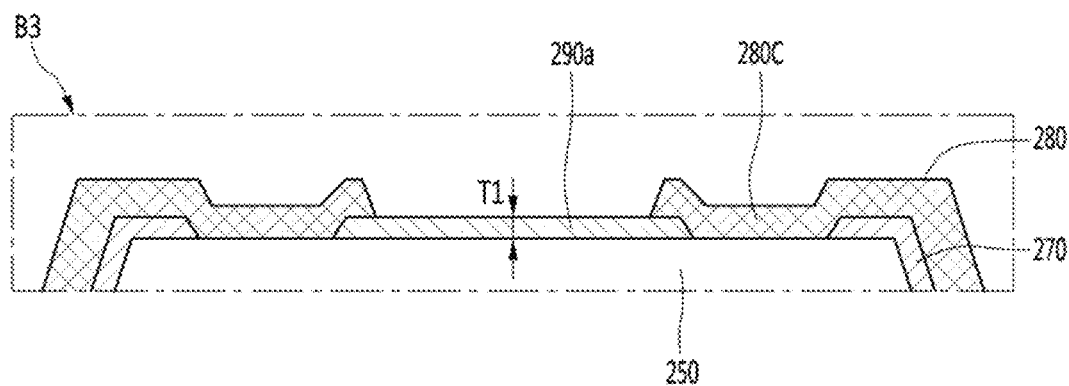

[FIG. 24]
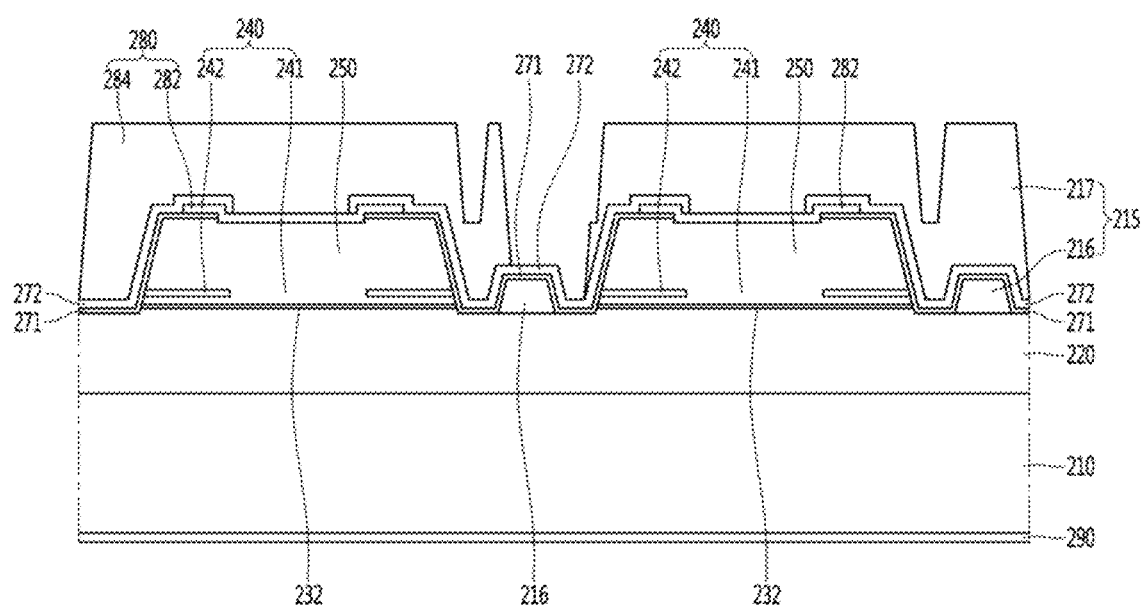

[FIG. 25]
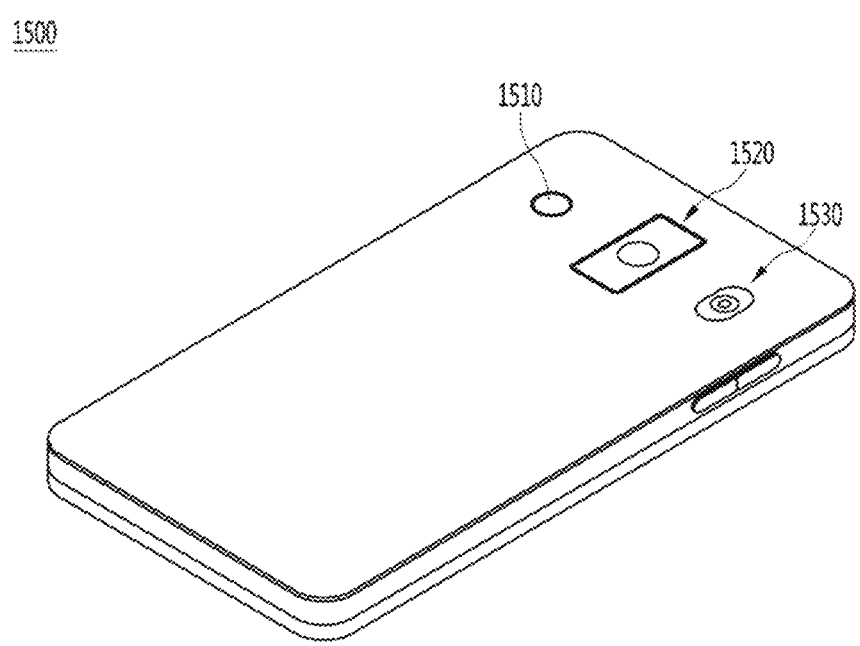

SURFACE EMITTING LASER DEVICE AND LIGHT EMITTING DEVICE INCLUDING THE SAME

CROSS REFERENCE TO RELATED APPLICATIONS

This application is the National Phase of PCT International Application No. PCT/KR2019/009313, filed on Jul. 26, 2019, which claims priority under 35 U.S.C. 119(a) to Patent Application No. 10-2018-0088131, filed in the Republic of Korea on Jul. 27, 2018, all of which are hereby expressly incorporated by reference into the present application.

TECHNICAL FIELD

The embodiment relates to a semiconductor device, and more particularly, to a surface emitting laser device and a light emitting device including the same.

BACKGROUND ART

A semiconductor device including a compound such as GaN or AlGaN has many advantages, such as having a wide and easily adjustable band gap energy, and thus can be used in various ways as a light emitting device, a light receiving device, and various diodes.

In particular, light emitting devices such as light emitting diodes and laser diodes using a group III-V or II-VI compound semiconductor material of semiconductors can be implemented various colors such as blue, red, green, and ultraviolet light. In addition, it is possible to implement highly efficient white light rays by using fluorescent materials or by combining colors. In addition, it has advantages of low power consumption, semi-permanent life, fast response speed, safety and environmental friendliness compared to conventional light sources such as fluorescent lamps and incandescent lamps.

In addition, when light-receiving devices such as photodetectors and solar cells are also manufactured using compound semiconductor materials of Groups III-V or II-VI of semiconductors, the development of device materials generates photocurrent by absorbing light in various wavelength ranges. By doing so, light in various wavelength ranges from gamma rays to radio wavelength ranges can be used. In addition, it has the advantages of fast response speed, safety, environmental friendliness, and easy control of device materials, so it can be easily used for power control or ultra-high frequency circuits or communication modules.

Accordingly, a light emitting diode backlight is replacing a cold cathode fluorescent lamp (CCFL) constituting a transmission module of an optical communication means and a backlight of a liquid crystal display (LCD) display device. Applications are expanding to white light emitting diode lighting devices that can replace fluorescent or incandescent bulbs, automobile headlights and traffic lights, and sensors that detect gas or fire.

In addition, applications can be extended to high-frequency application circuits, other power control devices, and communication modules. For example, in the conventional semiconductor light source device technology, there is a vertical-cavity surface emitting laser (VCSEL), which is used for optical communication, optical parallel processing, and optical connection. On the other hand, in the case of a laser diode used in such a communication module, it is designed to operate at a low current.

However, when the VCSEL is applied to a structured light sensor, LDAF (Laser Diode Autofocus), etc., since it operates at a high current, problems such as a decrease in luminous intensity output or an increase in threshold current occur.

In other words, in the conventional Epi structure of VCSEL (Vertical Cavity Surface Emitting Laser), response speed was important in the existing structure for data optical communication, but when developing a high power PKG for sensors, the light output and voltage efficiency becomes an important characteristic.

Meanwhile, in the related art, current crowding occurs in which the carrier density rapidly increases at the aperture edge as applied from a low current to a high current, thereby reducing the current injection efficiency. In addition, when the ohmic characteristics of the epi layer and the electrode are lowered and the resistance increases, the electric injection efficiency is further lowered, resulting in a problem of lowering the electrical characteristics.

In addition, according to the related art, when current crowding occurs at the aperture edge, damage to the apertures, which is the laser emission area, may occur. In addition, according to the related art, after the dominant mode is oscillated at a low current, and as a high current is applied, an optical problem of increasing the divergence angle of beams occurs due to the higher mode oscillation.

DISCLOSURE

Technical Problem

The embodiment is to provide a surface emitting laser device and a light emitting device including the same capable of improving electrical characteristics.

In addition, the embodiment is to provide a surface emitting laser device and a light emitting device including the same capable of improving optical characteristics as well as electrical characteristics.

Technical Solution

The surface emitting laser device according to the embodiment includes a substrate, a first reflective layer disposed on the substrate, an active layer disposed on the first reflective layer, an aperture layer disposed on the active layer and including an opening, and a second reflective layer disposed on the active layer, a transparent electrode layer disposed on the second reflective layer, and a metal electrode layer disposed on the transparent electrode layer.

The transparent electrode layer may include a first region 290a vertically overlapping with the opening and a plurality of second regions 290b extending from the first region 290a.

The plurality of second regions may be disposed to be spaced apart from each other outside the opening along the circumferential direction of the opening.

The plurality of second regions may be spaced apart from each other so as to correspond to the circumference of the opening.

The metal electrode layer may electrically contact the second reflective layer between the plurality of second regions 290b.

The second reflective layer includes a second-first region in direct contact with the transparent electrode layer and a second-second region in direct contact with the metal electrode layer, and the second-second region can be disposed between the second-first region.

The transparent electrode layer 290 includes a first contact area 290C in contact with the second-first region of the second reflective layer 250, and the metal electrode layer 280 includes a second contact area 280C in contact with the second-second region of the second reflective layer 250, and the first contact area 290C of the transparent electrode layer 290 is greater than the second contact area 280C of the metal electrode layer 280.

In addition, the surface emitting laser device according to the embodiment includes a substrate, a first reflective layer disposed on the substrate, an active layer disposed on the first reflective layer, an oxide layer including an aperture and an insulating region disposed on the active layer, a second reflective layer disposed on the oxide layer, a transparent electrode layer disposed on the second reflective layer, and a metal electrode layer disposed on the transparent electrode layer. The oxide layer may be referred to as an aperture region.

The transparent electrode layer may include a plurality of protrusions, the transparent electrode layer and the plurality of protrusions may directly contact the second reflective layer, and the metal electrode layer may directly contact the second reflective layer between the plurality of protrusions.

The second reflective layer may include a first region in direct contact with the transparent electrode layer and a second region in direct contact with the metal electrode layer, and the second region may be disposed between the first region.

The transparent electrode layer 290 includes a first contact area 290C in contact with a first area of the second reflective layer 250, and the metal electrode layer 280 includes a second contact area 280C in contact with a second area of the second reflective layer 250. And an area of the first contact area 290C of the transparent electrode layer 290 may be larger than an area of the second contact area 280C of the metal electrode layer 280.

In the second reflective layer 250, for the upper contact of the second reflective layer 250T in contact with the transparent electrode layer 290 and the metal electrode layer 280, the first contact area 290C may be in a range of 60 to 80%, and the second contact area 280C may be in a range from 40% to 20%.

In addition, the surface emitting laser device according to the embodiment includes a first reflective layer disposed on a substrate, an active region including an aperture and an insulating region disposed on the first reflective, a second reflective layer disposed on the aperture region, and a transparent electrode layer disposed on the second reflective layer; and a metal electrode layer disposed on the transparent electrode layer.

The transparent electrode layer may include a first ohmic region 290a and a plurality of second ohmic regions 290b protruding outward from the first ohmic region 290a and spaced apart from each other.

The transparent electrode layer may directly contact the second reflective layer at the first ohmic region 290a and the second ohmic region 290b.

The metal electrode layer may directly contact the second reflective layer between the plurality of protruding second ohmic regions 290b.

In addition, the surface emitting laser device according to the embodiment includes a first electrode, a substrate disposed on the first electrode, a first reflective layer disposed on the substrate, and a cavity area disposed on the first reflective layer, an active area disposed on the first reflective layer, an Aperture region including an aperture and an insulating area disposed on the active area, a second reflective layer disposed on the Aperture region, and a transparent electrode layer disposed in a first area of the second reflective layer vertically overlapping the aperture and a metal electrode layer disposed in a second area of the second reflective layer that do not vertically overlap the aperture.

The embodiment may further include a passivation layer disposed on a side surface and a portion of the upper surface of the second reflective layer 250.

The transparent electrode layer 290 may include a first ohmic region 290a spaced apart from the passivation layer 270 and a second ohmic region 290b contacting the passivation layer 270.

In addition, the transparent electrode layer 290 may include a first ohmic region 290a spaced apart from the passivation layer 270 to expose the second reflective layer and a second ohmic region 290b in contact with the passivation layer 270 not to expose the second reflective layer.

The first ohmic region 290a may be disposed to extend from the first region of the second reflective layer to a part of the second region of the second reflective layer.

The second ohmic region 290b may extend from the first region of the second reflective layer to the second region and may be disposed to extend above the passivation layer 270.

The first ohmic region 290a may be spaced apart from the passivation layer 270 to expose a part of the second reflective layer 250.

The exposed portions of the exposed second reflective layer may be plural, and may be spaced apart from each other.

The second ohmic region 290b may extend from the first ohmic region 290a to the passivation layer 270.

The second ohmic region 290b may be disposed to extend above the passivation layer 270.

The area of the first contact area 290C in which the transparent electrode layer 290 contacts the second reflective layer 250 may be greater than a second contact area 280C in which the metal electrode layer 280 contacts the exposed part 250P of the second reflective layer.

The thickness of the transparent electrode layer 290 may be 100 nm to 250 nm.

The light emitting device of the embodiment may include the surface emitting laser device.

Advantageous Effects

The embodiment may provide a surface emitting laser device and a light emitting device including the same capable of improving electrical characteristics by improving ohmic characteristics.

In addition, the embodiment may provide a surface emitting laser device and a light emitting device including the same having an optical characteristic with uniform radiance intensity between the aperture edge and the center by improving the current crowding phenomenon.

In addition, the embodiment may provide a surface emitting laser device and a light emitting device including the same capable of preventing damage to an aperture or an increase in divergence angle of beams by improving ohmic characteristics and current concentration.

DESCRIPTION OF DRAWINGS

FIG. 1 is a plan view of the surface emitting laser device according to the embodiment.

FIG. 2 is an enlarged plan view of a first emitter B1 of the surface emitting laser device according to the embodiment shown in FIG. 1.

FIG. 3A is a first cross-sectional view taken along line A1-A1' of the surface emitting laser device according to the embodiment shown in FIG. 2.

FIG. 3B is a second cross-sectional view taken along line A2-A2' of the surface emitting laser device according to the embodiment shown in FIG. 2.

FIG. 4 is an enlarged cross-sectional view of a portion B2 of an epi region of the surface emitting laser device according to the embodiment shown in FIG. 3A.

FIG. 5A is a detailed plan view including a transparent electrode layer disposed on a second reflective layer in the embodiment.

FIG. 5B is a cross-sectional view taken along line A1-A1' of the surface emitting laser device according to the embodiment shown in FIG. 5A.

FIG. 5C is a cross-sectional view taken along line A2-A2' of the surface emitting laser device according to the embodiment shown in FIG. 5A.

FIG. 6A is a detailed plan view including a metal electrode layer disposed on a transparent electrode layer in the embodiment.

FIG. 6B is a cross-sectional view taken along line A1-A1' of the surface emitting laser device according to the embodiment shown in FIG. 6A.

FIG. 6C is a cross-sectional view taken along line A2-A2' of the surface emitting laser device according to the embodiment shown in FIG. 6A.

FIG. 7 is an exemplary photograph including a contact area of a metal electrode layer in the related art.

FIG. 8 is an exemplary photograph including a contact area between a transparent electrode layer and a metal electrode layer with respect to a second reflective layer in the embodiment.

FIG. 9A is a carrier flow diagram in a cross-sectional view of the surface emitting laser device according to the embodiment shown in FIG. 6B.

FIG. 9B is a carrier flow chart in a cross-sectional view of the surface emitting laser device according to the embodiment shown in FIG. 6C.

FIGS. 10A and 10B are emission patterns and emission intensity data in a comparative invention.

FIGS. 11A and 11B are light emission patterns and light emission intensity data in the embodiment.

FIG. 12 is a light emission intensity data from an internal technology.

FIG. 13 is an enlarged view of a third area of the surface emitting laser device according to the embodiment shown in FIG. 6C.

FIG. 14 is resistance data according to a thickness of a transparent electrode layer in the surface emitting laser device according to the embodiment.

FIG. 15 is an ohmic characteristic data of the surface emitting laser device according to the embodiment.

FIG. 16A is light transmittance data in the surface emitting laser device according to the embodiment.

FIGS. 16B and 16C are comparative examples of light transmission characteristics in the second comparative example and the embodiment example, respectively.

FIGS. 17A to 23 are manufacturing process diagrams of the surface emitting laser device according to the embodiment.

FIG. 24 is a cross-sectional view of the surface emitting laser device according to another embodiment.

FIG. 25 is a perspective view of a mobile terminal to which a surface emitting laser device is applied according to the embodiment.

MODE FOR INVENTION

Hereinafter, embodiments that can be specifically realized for solving the above problems will be described with reference to the accompanying drawings.

In the description of the embodiment, in the case where it is described as being formed in "on or under" of each element, two elements are in direct contact with each other or one or more other elements are formed indirectly between the two elements. In addition, when expressed as "on or under", the meaning of not only an upward direction but also a downward direction based on one element may be included.

Embodiment

FIG. 1 is a plan view of the surface emitting laser device 201 according to the embodiment, and FIG. 2 is an enlarged plan view of a first emitter B1 of the surface emitting laser device according to the embodiment shown in FIG. 1.

FIG. 3A is a first cross-sectional view along line A1-A1' of the surface emitting laser device according to the embodiment shown in FIG. 2, and FIG. 3B is a second cross-sectional view along line A2-A2' of the surface emitting laser device according to the embodiment shown in FIG. 2.

FIG. 4 is an enlarged cross-sectional view of a portion B2 of the epi region of the surface emitting laser device according to the embodiment shown in FIG. 3A. In the drawings of the embodiment, the x-axis direction may be a direction parallel to the longitudinal direction of the substrate 210, and the y-axis may be a direction perpendicular to the x-axis.

First, referring to FIG. 1, the surface emitting laser device 201 according to the embodiment may include a light emitting part E and a pad part P. The light emitting part E includes a plurality of light emitting emitters, may include tens to hundreds of light emitting emitters.

Next, referring to FIGS. 3A and 3B, in the embodiment, the surface emitting laser device 201 includes a first electrode 215, a substrate 210, a first reflective layer 220, an active layer 232, and an Aperture region 240, a second reflective layer 250, a metal electrode layer 280, a passivation layer 270, and a transparent electrode layer 290. The transparent electrode layer 290 may be referred to as a translucent ohmic layer. The first reflective layer 220 and the second reflective layer 250 may include a Distributed Bragg Reflector (DBR), and the cavities 231 and 233 (refer to FIG. 4) may be disposed between the first reflective layer 220 and the second reflective layer 250.

The aperture region 240 may include an aperture 241 which is opening and an insulating region 242. The insulating region 242 serves as a current blocking function and may be referred to as an oxide layer, and the aperture region 240 may be referred to as an oxide region or an oxide layer, but is not limited thereto.

Hereinafter, the technical characteristics of the surface emitting laser device 201 according to the embodiment will be described centering on FIGS. 2, 3A, 3B, and 4, and the technical effects will be described with reference to the remaining drawings.

<Substrate, First Electrode>

First, referring to FIGS. 2, 3A and 3B, in the embodiment, the substrate 210 may be a conductive substrate or a non-conductive substrate. When a conductive substrate is used, a metal having excellent electrical conductivity can be used, and since it could sufficiently dissipate heat generated when the surface emitting laser device 201 is operated, a GaAs substrate or a metal substrate having high thermal conductivity is used, or silicon (Si) substrate, etc. can be used. When a non-conductive substrate is used, an AlN substrate, a sapphire ($Al_2O_3$) substrate, or a ceramic-based substrate may be used. In the embodiment, the substrate 210 may be formed of a semiconductor material, and doping may be performed. For example, the substrate 210 may be a semiconductor material doped with an n-type conductivity type, but the embodiment is not limited thereto.

In the embodiment, the first electrode 215 may be disposed under the substrate 210, and the first electrode 215 may be disposed as a single layer or multiple layers of a conductive material. For example, the first electrode 215 may be a metal, and may include at least one of aluminum (Al), titanium (Ti), chromium (Cr), nickel (Ni), copper (Cu), and gold (Au). And it is formed in a single-layer or multi-layer structure to improve electrical properties, thereby increasing light output. Since the first electrode 215 can function as an electrode for the first reflective layer 220 functioning as an n-type reflective layer, it may be referred to as an n-type electrode, but the first electrode 215 itself is not doped with a conductive element.

<First Reflective Layer, Second Reflective Layer>

Next, referring to FIG. 4, the first reflective layer 220 may be doped with a first conductivity type. The first conductivity-type dopant may include an n-type dopant such as Si, Ge, Sn, Se, and Te.

In addition, the first reflective layer 220 may include a gallium-based compound, for example, AlGaAs, but is not limited thereto. The first reflective layer 220 may be a Distributed Bragg Reflector (DBR). For example, the first reflective layer 220 may have a structure in which a first layer and a second layer made of materials having different refractive indices are alternately stacked at least once or more.

For example, as shown in FIG. 4, the first reflective layer 220 includes a first group first reflective layer 221 disposed on the substrate 210 and a second group of first reflective layers 222 disposed on the first group first reflective layer 221.

The first group first reflective layer 221 and the second group first reflective layer 222 may include a plurality of layers made of a semiconductor material having a composition formula of $Al_xGa_{(1-x)}As$ (0<x<1). If Al in each layer increases, the refractive index of each layer decreases, and when Ga increases, the refractive index of each layer may increase.

In addition, the thickness of each layer may be λ/4n, λ may be a wavelength of light generated from the active layer 232, and n may be a refractive index of each layer with respect to the above-described light of the wavelength. Here, λ may be 650 to 980 nanometers (nm), and n may be the refractive index of each layer. The first reflective layer 220 having such a structure may have a reflectance of 99.999% for light in a wavelength region of about 940 nanometers.

The thickness of the layer in each of the first reflective layers 220 may be determined according to a respective refractive index and a wavelength λ of light emitted from the active layer 232.

In addition, as shown in FIG. 4, the first group first reflective layer 221 and the second group first reflective layer 222 may be formed of a single layer or a plurality of layers, respectively.

For example, the first group first reflective layer 221 may include about 30 to 40 pairs of the first group first-first layer 221a and the first group first-second layer 221b. The first group first-first layer 221a may be formed to be thicker than the first group first-second layer 221b. For example, the first group first-first layer 221a may be formed to be about 40 to 60 nm, and the first group first-second layer 221b may be formed to be about 20 to 30 nm.

In addition, the second group first reflective layer 222 may also include about 5 to 15 pairs of the second group first-first layer 222a and the second group first-second layer 222b. The second group first-first layer 222a may be formed to be thicker than the second group first-second layer 222b. For example, the second group first-first layer 222a may be formed to be about 40 to 60 nm, and the second group first-second layer 222b may be formed to be about 20 to 30 nm.

In addition, as shown in FIG. 4, the second reflective layer 250 may include a gallium-based compound, for example, AlGaAs, and the second reflective layer 250 may be doped with a second conductivity type dopant.

For example, the second conductivity-type dopant may be a p-type dopant such as Mg, Zn, Ca, Sr, Ba, or the like.

The second reflective layer 250 may also be a Distributed Bragg Reflector (DBR). For example, the second reflective layer 250 may have a structure in which a plurality of layers made of materials having different refractive indices are alternately stacked at least once or more.

Each layer of the second reflective layer 250 may include AlGaAs, and in detail, may be made of a semiconductor material having a composition formula of $Al_xGa_{(1-x)}As$ (0<x<1). Here, when Al increases, the refractive index of each layer decreases, and when Ga increases, the refractive index of each layer may increase. In addition, the thickness of each layer of the second reflective layer 250 is λ/4n, λ may be a wavelength of light emitted from the active layer, and n may be a refractive index of each layer with respect to the light of the above-described wavelength.

The second reflective layer 250 having such a structure may have a reflectance of 99.9% for light in a wavelength region of about 940 nanometers.

The second reflective layer 250 may be formed by alternately stacking layers, and the number of pairs of layers in the first reflective layer 220 may be greater than the number of pairs of layers in the second reflective layer 250. In this case, as described above, the reflectance of the first reflective layer 220 is about 99.999%, which may be greater than the reflectance of 99.9% of the second reflective layer 250.

In the embodiment, the second reflective layer 250 may include a first group second reflective layer 251 disposed adjacent to the active layer 232 and a second group a second reflective layer 252 spaced apart from the active layer 232 than the first group second reflective layer 251.

As shown in FIG. 4, the first group second reflective layer 251 and the second group second reflective layer 252 may also be formed of a single layer or a plurality of layers, respectively.

For example, the first group second reflective layer 251 may include about 1 to 5 pairs of the first group second-first layer 251a and the first group second-second layer 251b. The first group second-first layer 251a may be formed to be thicker than the first group second-second layer 251b. For example, the first group second-first layer 251a may be formed to be about 40 to 60 nm, and the first group second-second layer 251b may be formed to be about 20 to 30 nm.

In addition, the second group second reflective layer 252 may also include about 5 to 15 pairs of the second group second-first layer 252a and the second group second-second layer 252b. The second group second-first layer 252a may be formed to be thicker than the second group second-second layer 252b. For example, the second group second-first layer 252a may be formed to be about 40 to 60 nm, and the second group second-second layer 252b may be formed to be about 20 to 30 nm.

<Active Layer>

With continued reference to FIG. 4, the active layer 232 may be disposed between the first reflective layer 220 and the second reflective layer 250.

The active layer 232 may include any one of a single well structure, a multiple well structure, a single quantum well structure, a multi quantum well (MQW) structure, a quantum dot structure, or a quantum wire structure.

The active layer 232 may include a well layer 232a and a barrier layer 232b using a compound semiconductor material of a group III-V element. The well layer 232a may be formed of a material having an energy band gap smaller than the energy band gap of the barrier layer 232b. The active layer 232 may be formed in 1 to 3 pair structure such as InGaAs/AlxGaAs, AlGaInP/GaInP, AlGaAs/AlGaAs, AlGaAs/GaAs, GaAs/InGaAs, but is not limited thereto. A dopant may not be doped into the active layer 232.

<Cavity>

In the embodiment, predetermined cavities 231 and 233 may be disposed between the first reflective layer 220 and the second reflective layer 250.

In an embodiment, the cavities may be disposed in contact with each of the active layers 232, and a first cavity 231 is disposed between the active layer 232 and the first reflective layer 220 and a second cavity 233 is disposed between the reflective layers 250 and the active layer 232.

The first cavity 231 and the second cavity 233 may be formed of an $Al_yGa_{(1-y)}As$ (0<y<1) material, but are not limited thereto. For example, the first cavity 231 and the second cavity 233 may each include a plurality of layers of $Al_yGa_{(1-y)}As$.

For example, the first cavity 231 may include a first-first cavity layer 231a and a first-second cavity layer 231b. The first-first cavity layer 231a may be spaced apart from the active layer 232 more than the first-second cavity layer 231b. The first-first cavity layer 231a may be formed to be thicker than the first-second cavity layer 231b, but is not limited thereto.

In addition, the second cavity 233 may include a second-first cavity layer 233a and a second-second cavity layer 233b. The second-second cavity layer 233b may be further spaced apart from the active layer 232 compared to the second-first cavity layer 233a. The second-second cavity layer 233b may be formed to be thicker than the second-first cavity layer 233a, but is not limited thereto. In this case, the second-second cavity layer 233b may be formed to be about 60 to 70 nm, and the first-first cavity layer 231a may be formed to be about 40 to 55 nm, but the present invention is not limited thereto.

<Aperture Region>

Referring back to FIG. 3A, in the embodiment, the aperture region 240 may include an insulating region 242 and an aperture 241. The aperture region 240 may be referred to as an opening region or an oxide layer.

The insulating region 242 may be formed of an insulating layer, for example, aluminum oxide, and may function as a current blocking region, and an aperture 241 that is a light emission region may be defined by the insulating region 242.

For example, when the aperture region 240 includes aluminum gallium arsenide (AlGaAs), the AlGaAs of the aperture region 240 reacts with $H_2O$ and the edge is changed to aluminum oxide ($Al_2O_3$). Accordingly, the insulating region 242 may be formed, and the central region that does not react with $H_2O$ may be an aperture 241 made of AlGaAs.

According to the embodiment, light emitted from the active layer 232 through the aperture 241 may be emitted to an upper region, and the aperture 241 may have excellent light transmittance compared to the insulating region 242.

Referring to FIG. 4, the insulating region 242 may include a plurality of layers, for example, a first insulating layer 242a and a second insulating layer 242b. The first insulating layer 242a may have a thickness equal to or different from that of the second insulating layer 242b.

<Metal Electrode Layer, Transparent Electrode Layer, Passivation Layer>

Referring back to FIGS. 3A and 3B together, the surface emitting laser device 201 according to the embodiment can be mesa etched from the second reflective layer 250 in a region around the aperture 241 to an insulating region 242 and an active layer 232. Also, a part of the first reflective layer 220 may be mesa etched.

Referring to FIGS. 2, 3A, and 3B, a passivation layer 270 may be disposed on a side surface and an upper surface of the mesa-etched light emitting structure and an upper surface of the second reflective layer 250. The passivation layer 270 is also disposed on a side surface of the surface emitting laser device 201 separated by device units, and protects and insulates the surface emitting laser device 201. The passivation layer 270 may be made of an insulating material, for example, a nitride or an oxide. For example, the passivation layer 270 may include at least one of polyimide, silica ($SiO_2$), or silicon nitride ($Si_3N_4$).

In addition, in the embodiment, the metal electrode layer 280 may be disposed on the second reflective layer 250, and the area between the metal electrode layers 280 to which the second reflective layer 250 is exposed can be correspond to the above-described aperture 241. The metal electrode layer 280 may be referred to as a second electrode. The metal electrode layer 280 may be made of a conductive material, for example, a metal. For example, the metal electrode layer 280 includes at least one of aluminum (Al), titanium (Ti), chromium (Cr), nickel (Ni), copper (Cu), and gold (Au), and can be formed as a single layer or multilayer structure.

One of the technical problems of the embodiment is to provide a surface emitting laser device and a light emitting device including the same capable of improving electrical characteristics.

In addition, one of the technical problems of the embodiment is to provide a surface emitting laser device and a light emitting device including the same capable of improving optical properties as well as electrical properties.

Referring to FIGS. 3A and 3B, the embodiment may include a transparent electrode layer 290 disposed between the second reflective layer 250 and the metal electrode layer 280 to solve the technical problem, and the transparent electrode layer 290 directly contacts the second reflective layer 250 to form an ohmic contact between the second reflective layer 250 and the transparent electrode layer 290, thereby improving electrical characteristics.

The transparent electrode layer 290 may be any one or more of ITO, AZO, GZO, ZnO, $Y_2O_3$ and $ZrO_2$.

Hereinafter, technical features of the embodiment will be described in more detail with reference to FIGS. 5A to 6C.

FIG. 5A is a detailed plan view including the transparent electrode layer 290 disposed on the second reflective layer 250 in the embodiment, and FIG. 5B is a cross-sectional view taken along line A1-A1' of the surface emitting laser device according to the embodiment shown in FIG. 5A and FIG. 5C is a cross-sectional view taken along line A2-A2' of the surface emitting laser device according to the embodiment shown in FIG. 5A.

In the embodiment, the second reflective layer 250 may include an upper contact second reflective layer 250T in contact with the transparent electrode layer 290 and the metal electrode layer 280.

Next, FIG. 6A is a detailed plan view including the metal electrode layer 280 disposed on the transparent electrode layer 290 in the embodiment, and FIG. 6B is a cross-sectional view along line A1-A1' of the surface emitting laser device according to the embodiment shown in FIG. 6A and FIG. 6C is a cross-sectional view along line A2-A2' of the surface emitting laser device according to the embodiment illustrated in FIG. 6A.

First, referring to FIGS. 5A, 5B, and 5C, in the embodiment, the transparent electrode layer 290 may include a first ohmic region 290a spaced apart from the passivation layer 270 and a second ohmic region 290b on the passivation layer 270.

The first ohmic region 290a may be spaced apart from the passivation layer 270 to expose a part of the second reflective layer 250, and there may be a plurality of exposed portions 250P of the exposed second reflective layer can be placed apart from each other.

The second ohmic region 290b may extend from the first ohmic region 290a to the passivation layer 270. In addition, the second ohmic region 290b may contact the passivation layer 270. In addition, the second ohmic region 290b may be disposed to extend above the passivation layer 270.

In the embodiment, the second ohmic regions 290b may be spaced apart from each other so as to correspond to the circumference of the aperture 241. For example, along a predetermined circle corresponding to the circumference of the aperture 241 and having a large radius but the same center, the second ohmic regions 290b may be disposed to be spaced apart from each other.

The second ohmic regions 290b are spaced apart from each other so as to be symmetrical to each other with respect to an imaginary line passing through the center of the aperture 241 to increase uniform injection efficiency of current.

In addition, the second ohmic region 290b may be formed in a shape such as a circular shape, a polygonal shape, or a multi-grid shape with rounded corners.

In the embodiment, an area in which the transparent electrode layer 290 contacts the second reflective layer 250 may be the first contact area 290C, and may be larger than the exposed area of the exposed portion 250P of the second reflective layer.

Next, as shown in FIGS. 6A, 6B, and 6C, the metal electrode layer 280 may be disposed on the transparent electrode layer 290 in the surface emitting laser device according to the embodiment.

The metal electrode layer 280 may be disposed on the transparent electrode layer 290 and the passivation layer 270 to be spaced apart from the aperture 241.

In this case, the metal electrode layer 280 is also disposed on the exposed portion 250P of the second reflective layer shown in FIG. 5A, and a region in which the metal electrode layer 280 contacts the exposed portion 250P of the second reflective layer may be a second contact area 280C.

A second contact area 280C in which the metal electrode layer 280 contacts the exposed portion 250P of the second reflective layer may include a plurality of areas. For example, referring to FIG. 6A, the second contact area 280C includes a second-first contact area 280C1, a second-second contact area 280C2, a second-third contact area 280C3, and a second-fourth contact area 280C4, but is not limited thereto.

Since the second-first contact area 280C1, the second-second contact area 280C2, the second-third contact area 280C3, and the second-fourth contact area 280C4 are spaced apart from each other so as to be symmetrical with respect to a virtual line of passing a center of the aperture 241, uniform injection efficiency of current can be improved.

In addition, the second-first contact area 280C1, the second-second contact area 280C2, the second-third contact area 280C3, and the second-fourth contact area 280C4 can be formed in a shape such as circular, polygonal, or a rounded square, etc.

The second-first contact area 280C1, the second-second contact area 280C2, the second-third contact area 280C3, and the second-fourth contact area 280C4 may be disposed between the second ohmic electrodes 290b protruding toward the passivation layer 280. In the embodiment, the area of the first contact area 290C in which the transparent electrode layer 290 contacts the second reflective layer 250 (see FIG. 5A) may be larger than the area of the second contact area 280C in which the metal electrode layer 280 contacts the exposed portion 250P of the second reflective layer.

Through this, according to the embodiment, the transparent electrode layer 290 directly contacts the second reflective layer 250 to form an ohmic contact between the second reflective layer 250 such that the transparent electrode layer 290 improves electrical and optical properties. In addition, the metal electrode layer 280 contacts the second reflective layer 250 in the second contact area 280C to maintain or improve the VF characteristics, thereby simultaneously improving electrical characteristics.

FIG. 7 is an exemplary photo including a contact area M1 of a metal electrode layer in the related art, and FIG. 8 is an exemplary photo including a contact area between a transparent electrode layer and a metal electrode layer with respect to the second reflective layer 250 in the embodiment.

Referring to FIG. 7, in the related art, an insulating layer such as $SiO_2$ is disposed on the p-DBR corresponding to the aperture, and the contact area M1 between the p-DBR and p-metal is in a circular shape at the periphery of the aperture. It was arranged uniformly, and accordingly, there was an issue of the current concentration phenomenon at the aperture edge.

Meanwhile, FIG. 8 is an exemplary photograph of a contact area between the metal electrode layer 280 and the transparent electrode layer 290 in the embodiment. This is an exemplary photograph including a first contact area 290C and a second contact area 280C of the transparent electrode layer 290 and the metal electrode layer 280 with respect to the second reflective layer 250 respectively.

According to the embodiment, a part of the second reflective layer 250 directly contacts the transparent electrode layer 290 and the first contact area 290C to prevent current concentration at the aperture edge and improve electrical characteristics by current diffusion. A capable surface emitting laser device and a light emitting device including the same can be provided, and at the same time, the metal electrode layer 280 directly contacts the second reflective layer 250 in the second contact area 280C, thereby maintaining or improving the VF characteristics such that the electrical properties can be improved at the same time.

In addition, according to the embodiment, a part of the second reflective layer 250 may directly contact the transparent electrode layer 290 at the first contact region 290C, thereby improving current crowding at the aperture edge. Accordingly, it is possible to provide a surface-emitting laser device and a light-emitting device including the same, having optical characteristics having uniform radiance intensity between an aperture edge and a center.

In addition, in the embodiment, a portion of the second reflective layer 250 may directly contact the transparent electrode layer 290 at the first contact region 290C to improve ohmic characteristics and improve current concentration. Through this, it is possible to prevent the aperture from being damaged or the conversion to the multi-mode due to the pinning effect of the laser oscillation mode. It is possible to provide a surface-emitting laser device, and a light emitting device including the same capable of preventing an increase in divergence angle of beams according to prevention of multi-mode conversion.

For example, FIG. 9A is a carrier flow chart in a cross-sectional view of the surface emitting laser device according to the embodiment shown in FIG. 6B, and FIG. 9B is a carrier flow chart in the cross-sectional view of the surface emitting laser device according to the embodiment shown in FIG. 6C.

Referring to FIGS. 6, 9A and 9B, the first current C1 is further diffused in the first contact area 290C in which the transparent electrode layer 290 of the embodiment contacts the second reflective layer 250. Accordingly, current can be uniformly and efficiently injected into the entire area of the aperture 241.

According to the embodiment, a portion of the second reflective layer 250 may directly contact the transparent electrode layer 290 at the first contact region 290C to prevent current concentration at the aperture edge. Through this, the embodiment may provide a surface-emitting laser device, and a light emitting device including the same capable of improving electrical characteristics and optical characteristics by current diffusion.

In the second contact area 280C where the metal electrode layer 280 contacts the second reflective layer 250, a second current C2 may be injected into the aperture 241, and the metal electrode layer 280 makes a second contact. By directly contacting the second reflective layer 250 in the second contact area 280C, the electrical characteristics may be simultaneously improved by maintaining or improving the VF3 characteristics.

FIG. 10A is light emission pattern data in a comparative invention, and FIG. 10B is light emission intensity data based on a long axis X1 and a short axis X2 in the comparative example.

According to the comparative invention, the light emission pattern at the aperture edge AE1 appears brighter than the center even in the light emission pattern in the near field due to the current concentration at the aperture edge AE1 as shown in FIG. 10A.

In particular, referring to FIG. 10B, due to the current concentration at the aperture edge AE1, the intensity of light emission in the far field differs significantly between the aperture edge AE1 and the aperture center AC1. It shows an uneven distribution of light emission. For example, in the comparative example, the luminous intensity of the aperture center AC1 is less than 30 to 40% compared to the luminous intensity of the aperture edge AE1, so the radiance intensity of the aperture edge and the center was significantly different, indicating an uneven emission distribution.

Meanwhile, FIG. 11A is light emission pattern data in the embodiment, and FIG. 11B is light emission intensity data based on the long axis X1 and the short axis X2 in the comparative example.

According to the embodiment, a part of the second reflective layer 250 directly contacts the transparent electrode layer 290 at the first contact area 290C to prevent current concentration at the aperture edge, and electrical and optical characteristics can be improved by current diffusion. Accordingly, the emission pattern at the aperture edge AE2 in the near field as shown in FIG. 11A is improved compared to the comparative example.

In particular, referring to FIG. 11B, according to the embodiment, since a part of the second reflective layer 250 directly contacts the transparent electrode layer 290 at the first contact region 290C, and a part of the second reflective layer 250 directly contacts the metal electrode layer 280, the ohmic characteristics and operating voltage characteristics are simultaneously improved to prevent current concentration at the aperture edge, and the electric and optical characteristics are simultaneously improved by current diffusion. Also, the luminous intensity in the far field (intensity) has a technical effect showing a uniform light emission distribution between the aperture edge AE2 and the aperture center AC2.

For example, in the embodiment, the luminous intensity of the aperture center AC2 is improved to 60% or more compared to the luminous intensity of the aperture edge AE2 such that there is a technical effect of making the radiance intensity very uniform between the aperture edge and the center.

Meanwhile, FIG. 12 is data of emission intensity in the applicant's internal technology. For example, the applicant's internal technology is a technology in which the metal electrode layer 280 does not have a region in contact with the second reflective layer 250 and the transparent electrode layer is in full contact with the second reflective layer 250.

In the case of such an internal technology, the improvement of the ohmic characteristics of the transparent electrode layer prevents current concentration at the aperture edge as shown in FIG. 12, and improves the electrical and optical characteristics by current diffusion. The luminous intensity has a technical effect of showing a uniform luminous distribution between the aperture edge (AE3) and the aperture center (AC3) compared to the comparative example. For example, in the embodiment, the luminous intensity of the aperture center AC3 is improved to 40% or more compared to the luminous intensity of the aperture edge AE3, so that there is a technical effect that (radiance intensity) becomes uniform between the aperture edge and the center.

Next, Table 1 below shows the evaluation data of the integrating sphere for internal techniques and embodiment examples.

TABLE 1

| Integrating sphere evaluation (@1.5 A) | Internal technology | Embodiment Example |
|---|---|---|
| VF3 (V) | 2.12 | 1.90 |
| Po (mW) | 823.9 | 909.1 |
| PCE(%) | 22.5 | 31.8 |
| Wp(nm) | 941.4 | 940.2 |
| Wh(nm) | 1.56 | 1.56 |

The applicant's internal technique is a technique in which the metal electrode layer 280 does not have a region in contact with the second reflective layer 250, and the transparent electrode layer is in contact with the second reflective layer 250 as described above. Meanwhile, the technique of the embodiment is illustrated as shown in 6a, the transparent electrode layer 290 contacts the second reflective layer 250 at the first contact region 290C, and the metal electrode layer 280 contacts the exposed portion 250P of the second reflective layer and is in contact with the second contact area 280C.

In this case, according to an exemplary embodiment, the area of the first contact area 290C in which the transparent electrode layer 290 contacts the second reflective layer 250 may be larger than the area of the second contact area 280C in which the metal electrode layer 280 contacts the exposed portion 250P of the second reflective layer.

For example, about 60 to 80% of the upper area exposed by the passivation layer 270 in the second reflective layer 250 may be in contact with the transparent electrode layer 290, and the remaining area can be contacted by the metal electrode layer 280, which can be between about 40% and 20%.

Accordingly, the area of the first contact area 290C in which the transparent electrode layer 290 contacts the second reflective layer 250 can be about 60-80% of the upper area of the second reflective layer 250 exposed by the passivation layer 270.

In addition, the area of the second contact area 280C in which the metal electrode layer 280 contacts the exposed portion 250P of the second reflective layer is among the upper area of the second reflective layer 250 exposed by the passivation layer 270 can be about 40-20%.

According to the embodiment, when the metal electrode layer 280 and the second reflective layer 250 directly contact each other, the operating voltage VF3 is excellent. According to this embodiment, compared to the internal technology, since the metal electrode layer 280 contacts the second reflective layer 250 at the second contact region 280C, the operating voltage VF3 is improved as shown in Table 1. In addition, since the transparent electrode layer 290 is in contact with the first contact region 290C, optical output and light emission intensity characteristics are remarkably improved by improving the ohmic characteristics.

For example, the power Po is improved by about 10.4% or more from 823.9 (mW) in the internal technology to 909.1 (mW) in the embodiment.

In addition, the power conversion efficiency (PCE) is about 22.5(%) in the internal technology, but is improved by about 41% to 31.8(%) in the embodiment. In the embodiment, when the area of the first contact area 290C between the transparent electrode layer 290 and the second reflective layer 250 is less than 40% of the upper area of the second reflective layer 250 exposed by the passivation layer 270, it may be difficult to improve the ohmic characteristics to have a significant effect. In addition, when the area of the first contact area 290C exceeds 80% of the upper area of the second reflective layer 250 exposed by the passivation layer 270, the contact area of the metal electrode layer 280 is narrowed, so that VF3 may be increased.

In addition, among the upper area of the second reflective layer 250 exposed by the passivation layer 270, if the area of the second contact area 280C in which the metal electrode layer 280 contacts the exposed portion 250P of the second reflective layer exceeds about 40%, the area of the first contact area 290C is relatively narrowed, so that improvement in ohmic characteristics may not be significant. In addition, when the area of the second contact area 280C is less than about 20% of the upper area of the second reflective layer 250 exposed by the passivation layer 270, the contact area of the metal electrode layer 280 is narrowed and thus VF3 can be increased.

Next, FIG. 13 is an enlarged view of a third area B3 of the surface emitting laser device according to the embodiment shown in FIG. 6C.

FIG. 14 is sheet resistance data according to the thickness of the transparent electrode layer 290 in the surface emitting laser device according to the embodiment.

According to the embodiment, by controlling the thickness of the transparent electrode layer 290 to a first thickness T1 of about 100 nm to about 250 nm, high ohmic characteristics between the transparent electrode layer 290 and the second reflective layer 250 can be obtained, such that the sheet resistance (Rs) can be significantly lowered.

On the other hand, in the second comparative example, when the thickness of the transparent electrode layer 290 is the second thickness T2, ohmic characteristics cannot be implemented and sheet resistance is high.

For example, as shown in Table 2 and FIG. 14 below, when the thickness of the transparent electrode layer is in the second thickness T2 of 20 nm to 60 min the second comparative example, the sheet resistance is high as 180 to 37 ohm/sq.

By the way, when the thickness of the transparent electrode layer 290 is controlled to be 100 nm to 250 nm, which is the first thickness T1 as in the embodiment, the sheet resistance can be significantly lowered. For example, when the thickness of the transparent electrode layer 290 is controlled to be 110 nm to 210 nm, the sheet resistance can be controlled to be remarkably low as 18 to 7 ohm/sq.

TABLE 2

| ITO thickness (nm) | 20 | 40 | 50 | 60 | 110 | 160 | 210 |
|---|---|---|---|---|---|---|---|
| Sheet resistance (ohm/sq) | 180 | 80 | 50 | 37 | 18 | 11 | 7 |

Next, FIG. 15 and Table 3 below are ohmic characteristics data of the surface emitting laser device according to the embodiment. In Table 3, E-04 may mean $10^{-4}$.

TABLE 3

| | p-GaAs/ITO Heat treatment | | | |
|---|---|---|---|---|
| | As-dep (comparative example) | 250° C. | 350° C. | 450° C. |
| Contact resistance (ohm*cm$^2$) | Non-Ohmic | 2.7E−04 | 1.0E−04 | 1.0E−04 |

First, in the embodiment, the second reflective layer 250 is a p-type reflective layer, and the transparent electrode layer 290 may have n-type conductivity. In the related art, on the other hand, n-type conductive ITO is deposited on the p-type reflective layer. There is a technical limitation that cannot be employed as a transparent electrode layer.

For example, as shown in Table 3 and FIG. 15, in the case of the second comparative example (As-dep) in which no special measures are taken after ITO is formed on a p-type reflective layer, for example, p-GaAs, the non-ohmic (Non-Ohmic) results will come out.

On the other hand, as in the embodiment, when ITO is formed on a p-type reflective layer, for example, p-GaAs, and a predetermined annealing treatment is performed, there is a technical effect that enables high ohmic characteristics at a thickness of 100 nm to 250 nm.

For example, when ITO is formed as the transparent electrode layer 290 on the p-GaAs, which is the second reflective layer 250, a predetermined annealing treatment is performed at 200° C. to 500° C., such that there is a technical effect of enabling high ohmic characteristics.

For example, if ITO is formed as the transparent electrode layer 290 on the p-GaAs, which is the second reflective layer 250, and then annealing is performed at 250° C. to 450° C., a higher ohmic characteristic can be implemented.

More specifically, it is necessary to consider the work function of each material as the physical condition of the ohmic, but in order to achieve ohmic characteristics, the work function of the ohmic layer must be larger than that of the p-type reflective layer.

However, in general, since the work function of ITO is about 4.3 eV and the work function of p-GaAs is about 5.5 eV, ohmic characteristics are not realized when TIO is deposited on p-GaAs.

However, in the embodiment, after depositing ITO on p-GaAs, through a predetermined annealing process, there is a technical effect in which high ohmic characteristics can be implemented by the tunneling effect in ITO having a thickness of 100 nm to 250 nm.

For example, according to the embodiment, after depositing ITO on p-GaAs, tunneling effect in ITO having a thickness of 100 nm to 250 nm through a predetermined annealing process in a range of 200° C. to 500° C. and nitrogen atmosphere such that there is a technical effect that enables high ohmic characteristics to be implemented.

In addition, according to the embodiment, after depositing ITO on p-GaAs, tunneling effect in ITO having a thickness of 100 nm to 250 nm through an annealing process of about 1 minute in a nitrogen atmosphere at 250° C. to 450° C. such that there is a technical effect that enables higher ohmic characteristics to be implemented.

For example, when Ga and indium of ITO are annealed on the p-GaAs surface according to the embodiment, out-diffusion of Ga is generated to form a Ga—In solid solution. As a result, Ga vacancy, that is, an acceptor, may increase on the p-GaAs surface.

In addition, according to the embodiment, the formation of a Ga—In—Sn-(Oxide) compound due to Ga out-diffusion during annealing causes the p-GaAs upper surface layer to form deep acceptor like Ga vacancies, thereby increasing the carrier concentration. In this way, p-GaAs/ITO ohmic formation due to tunneling may be possible.

Next, one of the technical problems of the embodiment is to provide a surface emitting laser device and a light emitting device including the same capable of preventing damage to apertures or an increase in divergence angle of beams.

FIG. 16A is light transmittance data in the surface emitting laser device according to the embodiment.

As shown in FIG. 16A, according to the embodiment, there is a technical effect of remarkably improving light transmittance by forming the transparent electrode layer 290 in about 100 nm to 250 nm on the second reflective layer 250.

For example, the wavelength to which the surface emitting laser device according to the embodiment is applicable (when λ is about 800 nm to 1,000 nm, the refractive index of the transparent electrode layer may be about 1.6 to 2.2, and the dielectric constant k may be about 0.1 or less).

FIGS. 16B and 16C are comparative examples of light transmission characteristics in the second comparative example and the embodiment example, respectively.

For example, as shown in FIG. 16A, in the LED technology, which is a second comparative example, the main wavelength of the LED (when λ is about 450 nm), the thickness of the highest transmittance as shown in FIG. 16B is about 100 nm, but the actual LED when applied, the ITO thickness is about 40 nm, because LED is a volume light emitting device, so thin ITO is advantageous, and there is an issue of power drop when applied over 100 nm.

On the other hand, when applying the surface emitting laser device according to the embodiment as shown in FIG. 16C, only the thickness of the vertical component due to lasing of the photon is considered. Therefore, the consideration of the thick ITO in consideration of the VCSEL wavelength, and there is a technical effect of remarkably improving light transmittance at a thickness of about 100 nm to 250 nm according to the embodiment.

According to the embodiment, optical properties due to anti-reflection (AR) coating may be improved by the transparent electrode layer 290 disposed on the second reflective layer 250.

In addition, the embodiment may provide a surface emitting laser device and a light emitting device including the same capable of preventing damage to apertures or an increase in divergence angle of beams.

Accordingly, according to the embodiment, by controlling the thickness of the transparent electrode layer 290 to a first thickness T1 of about 100 nm to about 250 nm, high ohmic characteristics between the transparent electrode layer 290 and the second reflective layer 250 can be obtained. At the same time, there is a complex technical effect that the sheet resistance (Rs) can be significantly reduced, and further, the light transmittance is significantly improved.

(Manufacturing Method)

Hereinafter, a manufacturing process of the surface emitting laser device according to the embodiment will be described with reference to FIGS. 17A to 23.

First, as shown in FIG. 17A, a light emitting structure including a first reflective layer 220, an active layer 232, and a second reflective layer 250 is formed on a substrate 210.

The substrate 210 may be formed of a material suitable for growth of semiconductor materials or a carrier wafer, may be formed of a material having excellent thermal conductivity, and may include a conductive substrate or an insulating substrate.

For example, when the substrate 210 is a conductive substrate, a metal having excellent electrical conductivity can be used, and since it can sufficiently dissipate heat generated when the surface emitting laser device 200 is operated, a GaAs substrate having high thermal conductivity, alternatively, a metal substrate or a silicon (Si) substrate may be used.

In addition, when the substrate 210 is a non-conductive substrate, an AlN substrate, a sapphire ($Al_2O_3$) substrate, or a ceramic-based substrate may be used.

In addition, in the embodiment, the same type of substrate as the first reflective layer 220 may be used as the substrate 210. For example, when the substrate 210 is a GaAs substrate of the same kind as the first reflective layer 220, the lattice constant of the substrate matches with that of the first reflective layer 210, so that defects such as lattice mismatch do not occur in the first reflective layer 220.

Next, the first reflective layer 220 may be formed on the substrate 210, and FIG. 17B is an enlarged view of a portion B2 of the surface emitting laser device according to the embodiment shown in FIG. 17A.

Hereinafter, a surface emitting laser device according to an embodiment will be described with reference to FIGS. 17A and 17B together.

The first reflective layer 220 may be grown using a method such as chemical vapor deposition (CVD), molecular beam epitaxy (MBE), sputtering, or hydroxide vapor phase epitaxy (HVPE).

The first reflective layer 220 may be doped with a first conductivity type. For example, the first conductivity-type dopant may include an n-type dopant such as Si, Ge, Sn, Se, and Te.

The first reflective layer 220 may include a gallium-based compound, for example, AlGaAs, but is not limited thereto. The first reflective layer 220 may be a Distributed Bragg Reflector (DBR). For example, the first reflective layer 220 may have a structure in which layers made of materials having different refractive indices are alternately stacked at least once or more.

For example, as shown in FIG. 17B, the first reflective layer 220 includes a first group first reflective layer 221 on the substrate 210 and second group first reflective layer 222 disposed on the first group first reflective layer 221.

The first group first reflective layer 221 and the second group first reflective layer 222 include a plurality of layers made of a semiconductor material having a composition formula of $Al_xGa_{(1-x)}As$ (0<x<1). If Al in each layer increases, the refractive index of each layer decreases, and when Ga increases, the refractive index of each layer may increase.

In addition, as shown in FIG. 17B, the first group first reflective layer 221 and the second group first reflective layer 222 may be formed of a single layer or a plurality of layers, respectively. For example, the first group first reflective layer 221 may include about 30 to 40 pairs of the first group first-first layer 221a and the first group first-second layer 221b. In addition, the second group first reflective layer 222 may also include about 5 to 15 pairs of the second group first-first layer 222a and the second group first-second layer 222b.

Next, the active layer 232 may be formed on the first reflective layer 220.

Referring to FIG. 17B, the active layer 232 may include an active layer 232, a first cavity 231 disposed below the active layer 232, and a second cavity 233 disposed above the active layer 232. The active layer 232 of the embodiment may include both the first cavity 231 and the second cavity 233, or may include only one of them.

The active layer 232 may include a well layer 232a and a barrier layer 232b using a compound semiconductor material of a group III-V element. The active layer 232 may be formed in 1 to 3 pair structure such as InGaAs/AlxGaAs, AlGaInP/GaInP, AlGaAs/AlGaAs, AlGaAs/GaAs, GaAs/InGaAs, but is not limited thereto. A dopant may not be doped into the active layer 232.

The first cavity 231 and the second cavity 233 may be formed of an $Al_yGa_{(1-y)}As$ (0<y<1) material, but are not limited thereto. For example, the first cavity 231 and the second cavity 233 may each include a plurality of layers of $Al_yGa_{(1-y)}As$.

For example, the first cavity 231 may include a first-first cavity layer 231a and a first-second cavity layer 231b. In addition, the second cavity 233 may include a second-first cavity layer 233a and a second-second cavity layer 233b.

Next, an AlGa-based layer 241a for forming the aperture region 240 may be formed on the active layer 232.

The AlGa-based layer 241a may include a material such as $Al_xGa_{(1-z)}As$ (0<z<1), but is not limited thereto.

The AlGa-based layer 241a may include a conductive material, and may include the same material as the first reflective layer 220 and the second reflective layer 250, but is not limited thereto.

For example, when the AlGa-based layer 241a includes an AlGaAs-based material, the AlGa-based layer 241a is a semiconductor material having a composition formula of $Al_xGa_{(1-x)}As$(0<x<1). It may be made of, for example, $Al_{0.98}Ga_{0.02}As$ may have a composition formula, but is not limited thereto.

The AlGa-based layer 241a may include a plurality of layers. For example, the AlGa-based layer 241a may include a first AlGa-based layer 241a1 and a second AlGa-based layer 241a2.

Next, a second reflective layer 250 may be formed on the AlGa-based layer 241a.

The second reflective layer 250 may include a gallium-based compound, for example, AlGaAs. For example, each layer of the second reflective layer 250 may include AlGaAs, and in detail, may be formed of a semiconductor material having a composition formula of $Al_xGa_{(1-x)}As$ (0<x<1).

The second reflective layer 250 may be doped with a second conductivity type dopant. For example, the second conductivity-type dopant may be a p-type dopant such as Mg, Zn, Ca, Sr, Ba, or the like. Meanwhile, the first reflective layer 220 may be doped with a p-type dopant, or the second reflective layer 250 may be doped with an n-type dopant.

The second reflective layer 250 may also be a Distributed Bragg Reflector (DBR). For example, the second reflective layer 250 may have a structure in which a plurality of layers made of materials having different refractive indices are alternately stacked at least once or more.

For example, the second reflective layer 250 includes a first group second reflective layer 251 disposed adjacent to the active layer 232 and a second group second reflective layer 252 spaced apart from the active layer 232.

In addition, the first group second reflective layer 251 and the second group second reflective layer 252 may be formed of a single layer or a plurality of layers, respectively. For example, the first group second reflective layer 251 may include about 1 to 5 pairs of the first group second-first layer 251a and the first group second-second layer 251b. In addition, the second group second reflective layer 252 may also include about 5 to 15 pairs of the second group second-first layer 252a and the second group second-second layer 252b.

Next, as shown in FIG. 18, a mesa region M may be formed by etching the light emitting structure using a predetermined mask (not shown). In this case, from the second reflective layer 250 to the AlGa-based layer 241a and the active layer 232 may be mesa etched, and a portion of the first reflective layer 220 may be mesa etched. In the mesa etching, the AlGa-based layer 241a and the active layer 232 can be removed from the second reflective layer 250 in the peripheral region by an inductively coupled plasma (ICP) etching method, and the mesa etching region is etched with a side slope.

Next, as shown in FIG. 19, the edge region of the AlGa-based layer 241a may be changed to the insulating region 242, for example, it may be changed by wet oxidation. Through this, the aperture region 240 including the insulating region 242 and the aperture 241 that is a non-oxidized region may be formed.

For example, when oxygen is supplied from the edge region of the AlGa-based layer 241a, AlGaAs of the AlGa-based layer reacts with $H_2O$ to form aluminum oxide ($Al_2O_3$). At this time, the reaction time and the like are adjusted so that the central region of the AlGa-based layer does not react with oxygen and only the edge region reacts with oxygen to form the insulating region 242 of aluminum oxide.

In addition, the embodiment may change the edge region of the AlGa-based layer to the insulating region 242 through ion implantation, but is not limited thereto. During ion implantation, photons may be supplied with an energy of 300 keV or more.

After the above-described reaction process, conductive AlGaAs may be disposed in the central region of the aperture region 240 and non-conductive $Al_2O_3$ may be disposed in the edge region. The AlGaAs in the central region is a portion through which light emitted from the active layer 232 proceeds to the upper region and may be defined as an aperture 241.

Next, as shown in FIG. 20, a passivation layer 270 may be formed on the upper surface of the light emitting structure, and a part of the upper surface of the second reflective layer 250 may be exposed.

The passivation layer 270 may include at least one of polymide, silica ($SiO_2$), or silicon nitride ($Si_3N_4$).

Next, as shown in FIGS. 21A to 21C, the transparent electrode layer 290 may be formed on the second reflective layer 250.

The transparent electrode layer 290 may be any one or more of ITO, AZO, GZO, ZnO, $Y_2O_3$ and $ZrO_2$.

For example, FIG. 21A is a detailed plan view including the transparent electrode layer 290 disposed on the second reflective layer 250 in the embodiment, and FIG. 21B is a cross-sectional view along line A1-A1' line of the surface-emission laser device, and FIG. 21C is a cross-sectional view along line A2-A2' of the surface emitting laser device according to the embodiment shown in FIG. 21A.

First, referring to FIGS. 21A, 21B, and 21C, in the embodiment, the transparent electrode layer 290 includes a first ohmic region 290*a* spaced apart from the passivation layer 270 and a second ohmic region 290*b* in contact with the first ohmic region 290*a*.

The first ohmic region 290*a* may be spaced apart from the passivation layer 270 to expose a part of the second reflective layer 250, and there may be a plurality of exposed portions 250P of the exposed second reflective layer and the plurality of exposed portions 250P can be placed apart from each other.

The second ohmic region 290*b* may extend from the first ohmic region 290*a* to the passivation layer 270. In addition, the second ohmic region 290*b* may contact the passivation layer 270. In addition, the second ohmic region 290*b* may extend and be disposed on the passivation layer 270.

In the embodiment, an area in which the transparent electrode layer 290 contacts the second reflective layer 250 may be a first contact area 290C, and may be larger than the exposed area of the exposed portion 250P of the second reflective layer.

Next, as shown in FIGS. 22A, 22B, and 22C, a metal electrode layer 280 may be disposed on the transparent electrode layer 290 in the surface emitting laser device according to the embodiment.

The metal electrode layer 280 may be disposed on the transparent electrode layer 290 and the passivation layer 270 to be spaced apart from the aperture 241.

In this case, the metal electrode layer 280 is also disposed on the exposed portion 250P of the second reflective layer shown in FIG. 21A, and a region in which the metal electrode layer 280 contacts the exposed portion 250P of the second reflective layer may be a second contact area 280C.

The metal electrode layer 280 may be made of a conductive material. For example, the metal electrode layer 280 includes at least one of aluminum (A), titanium (Ti), chromium (Cr), nickel (Ni), copper (Cu), and gold (Au) in a single layer or multilayer structure.

In the embodiment, the area of the first contact area 290C in which the transparent electrode layer 290 contacts the second reflective layer 250 (refer to FIG. 21A) is be larger than the area of the second contact area 280C equal to that of the metal electrode layer 280 contacting the exposed part 250P of the second reflective layer.

Through this, according to the embodiment, the transparent electrode layer 290 directly contacts the second reflective layer 250 to form an ohmic contact between the second reflective layer 250 and the transparent electrode layer 290 to improve electrical and optical properties. In addition, the metal electrode layer 280 contacts the second reflective layer 250 in the second contact area 280C to maintain or improve the VF characteristics, thereby simultaneously improving electrical characteristics.

According to the embodiment, a part of the second reflective layer 250 directly contacts the transparent electrode layer 290 at the first contact area 290C to prevent current concentration at the aperture edge such that a surface emitting laser device and a light emitting device including the same can improve electrical characteristics by current diffusion. At the same time, the metal electrode layer 280 directly contacts the second reflective layer 250 in the second contact area 280C, thereby maintaining or improving the VF characteristics such that the electrical properties can be improved at the same time.

In addition, according to the embodiment, a part of the second reflective layer 250 directly contacts the transparent electrode layer 290 at the first contact region 290C to improve current crowding at the aperture edge, thereby improving the aperture such that it is possible to provide a surface emitting laser device and a light emitting device including the same, having optical characteristics having uniform radiance intensity between an aperture edge and a center.

In addition, in the embodiment, a part of the second reflective layer 250 directly contacts the transparent electrode layer 290 at the first contact area 290C to improve the ohmic characteristics and improve the current density phenomenon, thereby preventing damaging the aperture or diverging the exit beam. It is possible to provide a surface emitting laser device a light emitting device including the same capable of preventing an increase in divergence angle of beams.

For example, as described above, FIG. 11A is light emission pattern data in the embodiment, and FIG. 1B is light emission intensity data based on the long axis X1 and the short axis X2 in the comparative example.

According to the embodiment, a part of the second reflective layer 250 directly contacts the transparent electrode layer 290 at the first contact area 290C to prevent current concentration at the aperture edge such that the electrical and optical characteristics by current diffusion can be improved. Accordingly, the emission pattern at the aperture edge AE2 in the near field as shown in FIG. 11A is improved compared to the comparative example.

In particular, referring to FIG. 11B, according to the embodiment, a part of the second reflective layer 250 directly contacts the transparent electrode layer 290 at the first contact region 290C, and a part of the metal electrode layer 280 at the second contact region 280C such that the ohmic characteristics and operating voltage characteristics are simultaneously improved by preventing current concentration at the aperture edge, and the electric and optical characteristics are simultaneously improved by current diffusion. Thus the luminous intensity in the far field (intensity) has a technical effect showing a uniform light emission distribution between the aperture edge AE2 and the aperture center AC2. For example, in the embodiment, the luminous intensity of the aperture center AC2 is improved to 60% or more compared to the luminous intensity of the aperture edge AE2, thereby there is a technical effect of making the radiance intensity very uniform of light emitting between the aperture edge and the center.

According to the embodiment, the area of the first contact area 290C in which the transparent electrode layer 290 contacts the second reflective layer 250 is a first contact area may be larger than the area of the second contact area 280C in which the metal electrode layer 280 contacts the exposed part 250P of the second reflective layer.

For example, about 60 to 80% of the upper area exposed by the passivation layer 270 in the second reflective layer 250 may be in contact with the transparent electrode layer 290, and the remaining area can be contacted by the metal electrode layer 280, which can be ranged between about 40% and 20%.

Accordingly, the area of the first contact area 290C in which the transparent electrode layer 290 contacts the second reflective layer 250 is about 60~80% of the upper area of the second reflective layer 250 exposed by the passivation layer 270.

In addition, the area of the second contact area 280C in which the metal electrode layer 280 contacts the exposed portion 250P of the second reflective layer can be about 40-20% among the upper area of the second reflective layer 250 exposed by the passivation layer 270.

According to the embodiment, when the metal electrode layer 280 and the second reflective layer 250 are in direct contact, the operating voltage (VF3) is excellent. And according to this embodiment, since the second reflective layer 250 and the second contact area 280C of the metal electrode layer 280 are in-contact with each other, the operating voltage VF3 can be improved. In addition, since the transparent electrode layer 290 is in contact with the first contact region 290C, optical output and light emission intensity characteristics are remarkably improved by improving the ohmic characteristics.

Next, FIG. 23 is an enlarged view of a third area B3 of the surface emitting laser device according to the embodiment shown in FIG. 22C.

Meanwhile, FIG. 14 shows resistance data according to the thickness of the transparent electrode layer 290 in the surface emitting laser device according to the embodiment. Since the thickness of the transparent electrode layer 290 is changed to a first thickness of about 100 nm to about 250 nm (by controlling T), high ohmic characteristics can be obtained between the transparent electrode layer 290 and the second reflective layer 250, and the sheet resistance Rs can be significantly reduced.

On the other hand, in the second comparative example, when the thickness of the transparent electrode layer 290 is the second thickness T2, ohmic characteristics cannot be implemented and sheet resistance is high.

However, when controlling the thickness of the transparent electrode layer 290 to 100 nm to 250 nm as in the embodiment, it is possible to control the sheet resistance to be significantly lower. For example, when the thickness of the transparent electrode layer 290 is controlled to be 110 nm to 210 nm, the sheet resistance can be controlled to be remarkably low as 18 to 7 ohm/sq.

Also, in the embodiment, the second reflective layer 250 is a p-type reflective layer, and the transparent electrode layer 290 may have n-type conductivity.

Meanwhile, in the related art, there is a technical limitation in that n-type conductive ITO cannot be employed as a transparent electrode layer on a p-type reflective layer.

On the other hand, as in the embodiment, when ITO is formed on a p-type reflective layer, for example, p-GaAs, and a predetermined annealing treatment is performed, there is a technical effect that enables high ohmic characteristics at a thickness of 100 nm to 250 nm.

For example, when ITO is formed as the transparent electrode layer 290 on the p-GaAs, which is the second reflective layer 250, a predetermined annealing treatment is performed at 200° C. to 500° C., such that there is a technical effect of enabling high ohmic characteristics.

For example, if ITO is formed as the transparent electrode layer 290 on the p-GaAs, which is the second reflective layer 250, and then annealing is performed at 250° C. to 450° C., a higher ohmic characteristic can be implemented.

Specifically, the work function ($\Phi$) of each material should be considered as the physical condition of the ohmic, but in order to become an ohmic characteristic, the work function of the ohmic layer must be larger than that of the p-type reflective layer.

However, in general, since the work function of ITO is about 4.3 eV and the work function of p-GaAs is about 5.5 eV, ohmic characteristics cannot be implemented when TIO is deposited on p-GaAs.

However, in the embodiment, after depositing ITO on p-GaAs, through a predetermined annealing process, there is a technical effect in which high ohmic characteristics can be implemented by the tunneling effect in ITO having a thickness of 100 nm to 250 nm.

For example, according to the embodiment, after depositing ITO on p-GaAs, tunneling effect in ITO having a thickness of 100 nm to 250 nm through a predetermined annealing process in a range of 200° C. to 500° C. and nitrogen atmosphere such that there is a technical effect that enables high ohmic characteristics to be implemented.

In addition, according to the embodiment, after depositing ITO on p-GaAs, tunneling effect in ITO having a thickness of 100 nm to 250 nm through an annealing process of about 1 minute in a nitrogen atmosphere at 250° C. to 450° C. such that there is a technical effect that enables higher ohmic characteristics to be implemented.

For example, when Ga and indium of ITO are annealed on the p-GaAs surface according to the embodiment, out-diffusion of Ga is generated to form a Ga—In solid solution. As a result, Ga vacancy, that is, an acceptor, may increase on the p-GaAs surface.

In addition, according to the embodiment, the formation of a Ga—In—Sn-(Oxide) compound due to Ga out-diffusion during annealing causes the p-GaAs upper surface layer to form deep acceptor like Ga vacancies, thereby increasing the carrier concentration. In this way, p-GaAs/ITO ohmic formation due to tunneling may be possible.

In addition, according to the embodiment, there is a technical effect of remarkably improving light transmittance by forming the transparent electrode layer 290 in about 100 nm to 250 nm on the second reflective layer 250.

For example, the wavelength $\lambda$ to which the surface emitting laser device according to the embodiment may be about 800 nm to 1,000 nm, the refractive index (n) of the transparent electrode layer may be about 1.6 to 2.2, and the extinction coefficient or the absorption index k value may be 0.1 or less.

According to the embodiment, optical properties due to anti-reflection (AR) coating may be improved by the transparent electrode layer 290 disposed on the second reflective layer 250.

In addition, the embodiment may provide a surface emitting laser device capable of preventing damage to apertures or an increase in divergence angle of beams, and a light emitting device including the same.

In addition, as described above, according to the embodiment, by controlling the thickness of the transparent electrode layer 290 to a first thickness T1 of about 100 nm to about 250 nm, a high level ohmic characteristics between the transparent electrode layer 290 and the second reflective layer 250 can be obtained, sheet resistance (Rs) can be significantly lowered, and further, there is a complex technical effect of remarkably improving light transmittance.

Another Example

Next, FIG. 24 is another cross-sectional view of the surface emitting laser device according to the embodiment.

In addition to the vertical type, the surface emitting laser device according to the embodiment may have a flip chip type in which the first electrode 215 and the metal electrode layer 280 have the same direction as shown in FIG. 24.

For example, as shown in FIG. 24, the surface emitting laser device according to another embodiment includes a first electrode 215, a substrate 210, a first reflective layer 220, an active layer 232, an aperture region 240, and a reflective layer 250, a metal electrode layer 280, a first passivation layer 271, a second passivation layer 272, and a non-reflective layer 290. In this case, the reflectivity of the second reflective layer 250 may be designed to be higher than that of the first reflective layer 220.

In this case, the first electrode 215 may include a first contact electrode 216 and a first pad electrode 217, and a first contact electrode (eg, a first contact electrode) on the first reflective layer 220 exposed through a predetermined mesa process. The first pad electrode 217 may be electrically connected to the first contact electrode 216.

The first electrode 215 may be made of a conductive material, for example, a metal. For example, the first electrode 215 includes at least one of aluminum (Al), titanium (Ti), chromium (Cr), nickel (Ni), copper (Cu), and gold (Au).

When the first reflective layer 220 is an n-type reflective layer, the first electrode 215 may be an electrode for the n-type reflective layer.

Next, the metal electrode layer 280 may include a second contact electrode 282 and a second pad electrode 284, and the second contact electrode 282 is electrically connected to the second reflective layer 250. The second pad electrode 284 may be electrically connected to the second contact electrode 282.

When the second reflective layer 250 is a p-type reflective layer, the metal electrode layer 280 may be an electrode for the p-type reflective layer.

The first insulating layer 271 and the second insulating layer 272 may be made of an insulating material, for example, nitride or oxide, for example, polyimide, silica ($SiO_2$) or it may include at least one of silicon nitride ($Si_3N_4$).

INDUSTRIAL APPLICABILITY

The surface emitting laser device according to the embodiment may be applied to a mobile terminal or the like.

For example, FIG. 25 is a perspective view of a mobile terminal to which a surface emitting laser device is applied according to the embodiment.

As shown in FIG. 25, the mobile terminal 1500 according to the embodiment may include a camera module 1520, a flash module 1530, and an autofocus device 1510 provided on the rear side. Here, the autofocus device 1510 may include one of the packages of the surface emitting laser device according to the above-described embodiment as a light emitting unit.

The flash module 1530 may include a light emitting device that emits light therein. The flash module 1530 may be operated by a camera operation of a mobile terminal or a user's control.

The camera module 1520 may include an image capturing function and an auto focus function. For example, the camera module 1520 may include an auto focus function using an image.

The auto focus device 1510 may include an auto focus function using a laser. The auto focus device 1510 may be mainly used in a condition in which an auto focus function using an image of the camera module 1520 is deteriorated, for example, in a proximity or dark environment of 10 m or less. The autofocusing device 1510 may include a light emitting unit including a vertical cavity surface emission laser (VCSEL) semiconductor device, and a light receiving unit that converts light energy such as a photodiode into electrical energy.

Features, structures, effects, and the like described in the above embodiments are included in at least one embodiment, and are not necessarily limited to only one embodiment. Furthermore, the features, structures, effects, and the like illustrated in each embodiment may be combined or modified for other embodiments by a person having ordinary skill in the field to which the embodiments belong. Therefore, contents related to such combinations and modifications should be interpreted as being included in the scope of the embodiments.

Although the embodiments have been described above, these are only examples and are not intended to limit the embodiments, and those of ordinary skill in the field to which the embodiments belong are not departing from the essential characteristics of the embodiments. It will be seen that branch transformation and application are possible. For example, each component specifically shown in the embodiment can be modified and implemented. And differences related to these modifications and applications should be construed as being included in the scope of the embodiments set in the appended claims.

The invention claimed is:

1. A surface emitting laser device comprising:
   a substrate;
   a first reflective layer disposed on the substrate;
   an active layer disposed on the first reflective layer,
   an aperture layer disposed on the active layer and including an opening;
   a second reflective layer disposed on the active layer;
   a transparent electrode layer disposed on the second reflective layer; and
   a metal electrode layer disposed on the transparent electrode layer,
   wherein the transparent electrode layer includes a first region vertically overlapping the opening and a plurality of second regions extending from the first region,
   wherein the plurality of second regions are spaced apart from each other on an outer side of the opening along a circumferential direction of the opening, and wherein the metal electrode layer electrically contacts the second reflective layer between the plurality of second regions.

2. The surface emitting laser device according to claim 1, wherein the second reflective layer includes a second-first region in direct contact with the transparent electrode layer and a second-second region in direct contact with the metal electrode layer, and the second-second region is disposed between second-first regions.

3. The surface emitting laser device according to claim 2, wherein the transparent electrode layer includes a first contact area in contact with the second-first region of the second reflective layer, and the metal electrode layer includes a second contact area in contact with the second-second region of the second reflective layer, and
wherein the first contact area of the transparent electrode layer is greater than the second contact area of the metal electrode layer.

4. The surface emitting laser device according to claim 3, in an upper contact area of the second reflective layer in contact with the transparent electrode layer and the metal electrode layer, the first contact area is in the range of 60 to 80%, and the second contact area is in the range of 40% to 20%.

5. A surface emitting laser device comprising:
a first reflective layer disposed on a substrate;
an active layer disposed on the first reflective layer;
an aperture region disposed on the active layer and including an aperture and an insulating region;
a second reflective layer disposed on the aperture region;
a transparent electrode layer disposed on the second reflective layer; and
a metal electrode layer disposed on the transparent electrode layer,
wherein the transparent electrode layer includes a first ohmic region and a plurality of second ohmic regions protruding outward from the first ohmic region and spaced apart from each other,
wherein the transparent electrode layer directly contacts the second reflective layer at the first ohmic region and the second ohmic regions, and
wherein the metal electrode layer directly contacts the second reflective layer between the plurality of second ohmic regions.

6. The surface emitting laser device according to claim 5, wherein the first ohmic region vertically overlaps the aperture, and the second ohmic region vertically overlaps the insulating region.

7. The surface emitting laser device according to claim 5, further comprising:
a passivation layer disposed on a side surface and a portion of an upper surface of the second reflective layer,
wherein the first ohmic region is spaced apart from the passivation layer to expose a part of the second reflective layer, and
wherein the second ohmic region contacts the passivation layer and does not expose the second reflective layer.

8. The surface emitting laser device according to claim 7, wherein the second ohmic region is disposed to extend to an upper side of the passivation layer,
wherein the second ohmic region extends from the first ohmic region toward the passivation layer, and
wherein the metal electrode layer is disposed on the second ohmic region and spaced apart from the second reflective layer.

9. The surface emitting laser device according to claim 5, wherein a first contact area in which the transparent electrode layer contacts the second reflective layer is greater than a second contact area in which the metal electrode layer contacts the exposed part of the second reflective layer, and
wherein in an upper contact area of the second reflective layer in contact with the transparent electrode layer and the metal electrode layer, the first contact area is in the range of 60 to 80%, and the second contact area is in the range of 40% to 20%.

10. A light emitting device comprising the surface emitting laser device of claim 1.

11. The surface emitting laser device according to claim 3, wherein the second contact area includes a second-first contact area, a second-second contact area, a second-third contact area, and a second-fourth contact area which are spaced apart from each other.

12. The surface emitting laser device according to claim 11, wherein the second-first contact area, the second-second contact area, the second-third contact area, and the second-fourth contact area are spaced apart from each other so as to be symmetrical with respect to a virtual line of passing a center of the aperture layer.

13. The surface emitting laser device according to claim 1, wherein the second reflective layer is a p-type reflective layer, and
wherein the transparent electrode layer has an n-type conductivity.

14. The surface emitting laser device according to claim 1, wherein the transparent electrode layer has a thickness of 100 nm to 250 nm.

15. The surface emitting laser device according to claim 1, wherein the transparent electrode layer has been annealed on the second reflective layer.

16. The surface emitting laser device according to claim 9, wherein the second contact area includes a second-first contact area, a second-second contact area, a second-third contact area, and a second-fourth contact area which are spaced apart from each other.

17. The surface emitting laser device according to claim 16, wherein the second-first contact area, the second-second contact area, the second-third contact area, and the second-fourth contact area are spaced apart from each other so as to be symmetrical with respect to a virtual line of passing a center of the aperture.

18. The surface emitting laser device according to claim 5, wherein the second reflective layer is a p-type reflective layer, and
wherein the transparent electrode layer has a n-type conductivity, and
wherein the transparent electrode layer has a thickness of 100 nm to 250 nm.

19. The surface emitting laser device according to claim 5, wherein the transparent electrode layer has been annealed on the second reflective layer.

20. A light emitting device comprising the surface emitting laser device of claim 5.

* * * * *